(12) United States Patent
Kawakami et al.

(10) Patent No.: US 7,411,298 B2
(45) Date of Patent: Aug. 12, 2008

(54) SOURCE/DRAIN ELECTRODES, THIN-FILM TRANSISTOR SUBSTRATES, MANUFACTURE METHODS THEREOF, AND DISPLAY DEVICES

(75) Inventors: Nobuyuki Kawakami, Kobe (JP); Toshihiro Kugimiya, Kobe (JP); Hiroshi Gotoh, Kobe (JP); Katsufumi Tomihisa, Kobe (JP); Aya Hino, Kobe (JP)

(73) Assignee: Kabushiki Kaisha Kobe Seiko Sho (Kobe Steel, Ltd.), Kobe-shi (JP)

( * ) Notice: Subject to any disclaimer, the term of this patent is extended or adjusted under 35 U.S.C. 154(b) by 76 days.

(21) Appl. No.: 11/461,907

(22) Filed: Aug. 2, 2006

(65) Prior Publication Data

US 2007/0040172 A1 Feb. 22, 2007

(30) Foreign Application Priority Data

Aug. 17, 2005 (JP) ............................. 2005-236994

(51) Int. Cl.
*H01L 23/48* (2006.01)
(52) U.S. Cl. .................. 257/741; 438/652; 438/653
(58) Field of Classification Search ................ 257/750, 257/751, 771, 66, 73, E29.111–E29.117; 438/652–657
See application file for complete search history.

(56) References Cited

U.S. PATENT DOCUMENTS 5,514,909 A    5/1996   Yamamoto et al.
6,033,542 A    3/2000   Yamamoto et al.

(Continued)

FOREIGN PATENT DOCUMENTS

JP          8-330600        12/1996

(Continued)

OTHER PUBLICATIONS

U.S. Appl. No. 11/743,916, filed May 3, 2007, Kawakami et al.

(Continued)

*Primary Examiner*—Zandra Smith
*Assistant Examiner*—Paul E Patton
(74) *Attorney, Agent, or Firm*—Oblon, Spivak, McClelland, Maier & Neustadt, P.C.

(57) ABSTRACT

A source/drain electrode is used in a thin-film transistor substrate containing a substrate, a thin-film transistor semiconductor layer, source/drain electrodes, and a transparent picture electrode. The source/drain electrode includes a nitrogen-containing layer and a thin film of pure aluminum or an aluminum alloy. Nitrogen of the nitrogen-containing layer binds to silicon of the thin-film transistor semiconductor layer, and the thin film of pure aluminum or aluminum alloy is connected to the thin-film transistor semiconductor layer through the nitrogen-containing layer.

15 Claims, 8 Drawing Sheets

U.S. PATENT DOCUMENTS

| | | | |
|---|---|---|---|
| 6,064,091 A * | 5/2000 | Deane et al. | ................. 257/347 |
| 6,096,438 A | 8/2000 | Takagi et al. | |
| 6,218,206 B1 | 4/2001 | Inoue et al. | |
| 6,252,247 B1 | 6/2001 | Sakata et al. | |
| 6,534,349 B1 * | 3/2003 | Kubota et al. | ................ 438/158 |
| 2003/0047812 A1 | 3/2003 | Hagihara et al. | |
| 2004/0126608 A1 | 7/2004 | Gotoh et al. | |
| 2005/0184395 A1 | 8/2005 | Gotoh et al. | |
| 2005/0224795 A1 | 10/2005 | Gotoh et al. | |
| 2006/0007366 A1 | 1/2006 | Gotoh et al. | |
| 2006/0091792 A1 | 5/2006 | Kugimiya | |
| 2007/0040172 A1 | 2/2007 | Kawakami et al. | |

FOREIGN PATENT DOCUMENTS

| | | |
|---|---|---|
| JP | 11-283934 | 10/1999 |
| JP | 11-284195 | 10/1999 |
| JP | 11-337976 | 12/1999 |
| JP | 2003-273109 | 9/2003 |
| JP | 2004-104101 | 4/2004 |

OTHER PUBLICATIONS

U.S. Appl. No. 11/431,580, filed May 11, 2006, Toshihiro Kugimiya et al.

U.S. Appl. No. 11/471,595, filed Jun. 21, 2006, Hiroshi Gotoh et al.

U.S. Appl. No. 11/349,520, filed Feb. 8, 2006, Hiroshi Gotoh et al.

U.S. Appl. No. 11/341,531, filed Jan. 30, 2006, Toshihiro Kugimiya et al.

U.S. Appl. No. 11/461,927, filed Aug. 2, 2006, Kugimiya et al.

* cited by examiner

SOURCE/DRAIN ELECTRODES, THIN-FILM TRANSISTOR SUBSTRATES, MANUFACTURE METHODS THEREOF, AND DISPLAY DEVICES

BACKGROUND OF THE INVENTION

1. Field of the Invention

The present invention relates to source/drain electrodes and substrates for use in thin-film transistors of liquid crystal displays, semiconductor devices, and optical components. It also relates to methods for manufacturing the substrates, and display devices. Specifically, it relates to novel source/drain electrodes containing a thin film of pure aluminum or aluminum alloy as a component.

2. Description of the Related Art

Liquid crystal display devices are used in a variety of applications ranging from small-sized mobile phones to large-sized television sets with 30-inch or larger screens. They are categorized by the pixel driving method into simple-matrix liquid crystal display devices and active-matrix liquid crystal display devices. Of these, active-matrix liquid crystal display devices having a thin-film transistor (hereinafter briefly referred to as TFT) as a switching element are widely used, because they realize high-definition images and can produce images at high speed.

With reference to FIG. 1, the configuration and operating principles of a representative liquid crystal panel for use in active-matrix liquid crystal display devices will be illustrated, by taking a substrate with a TFT array (hereinafter also referred to as "thin-film transistor substrate") using a hydrogenated amorphous silicon as an active semiconductor layer (hereinafter also referred to as "amorphous silicon thin-film transistor substrate") as an example.

The liquid crystal panel 100 in FIG. 1 includes a thin-film transistor substrate 1, a counter substrate 2, and a liquid crystal layer 3. The counter substrate 2 is arranged so as to face the thin-film transistor substrate 1. The liquid crystal layer 3 is arranged between the thin-film transistor substrate 1 and the counter substrate 2 and functions as an optical modulation layer. The thin-film transistor substrate 1 includes an insulative glass substrate 1a, and arranged thereon thin-film transistors 4, a transparent picture electrode 5, and an interconnection section 6 containing scanning lines and signal lines. The transparent picture electrode 5 is made typically from an indium tin oxide (ITO) film containing indium oxide ($In_2O_3$) and about 10 percent by mass of tin oxide (SnO). The thin-film transistor substrate 1 is driven by a driver circuit 13 and a control circuit 14 connected thereto through a TAB tape 12.

The counter substrate 2 includes an insulative glass substrate 1b, and a common electrode 7, a color filter 8, and a light shielding film 9. The common electrode 7 is arranged overall the side of the glass substrate 1b facing the thin-film transistor substrate 1. The counter substrate 2 as a whole functions as a counter electrode. The color filter 8 is arranged at such a position as to face the transparent picture electrode 5. The light shielding film 9 is arranged at such a position as to face the thin-film transistor 4 and the interconnection section 6 on the thin-film transistor substrate 1. The counter substrate 2 further has an alignment layer 11 for aligning liquid crystal molecules (not shown) in the liquid crystal layer 3 to a predetermined direction.

The liquid crystal panel further includes polarizers 10a and 10b arranged outsides (on sides opposite to the liquid crystal layer 3) of the thin-film transistor substrate 1 and the counter substrate 2, respectively.

In the liquid crystal panel 100, an electrical field formed between the counter electrode 2 (common electrode 7) and the transparent picture electrode 5 controls the alignment direction of liquid crystal molecules in the liquid crystal layer 3 to thereby modulate light passing through the liquid crystal layer 3. This controls the quantity of light transmitted through the counter substrate 2 to thereby produce and display an image.

Next, the configuration and operating principles of a conventional amorphous silicon thin-film transistor substrate for use in liquid crystal panels will be illustrated in detail with reference to FIG. 2. FIG. 2 is an enlarged view of the essential part A in FIG. 1.

With reference to FIG. 2, scanning lines (thin-film gate interconnections) 25 are arranged on a glass substrate (not shown). A part of the scanning lines 25 functions as a gate electrode 26 to control (to turn on and off of) the thin-film transistor. A gate insulator (silicon nitride film) 27 is arranged so as to cover the gate electrode 26. Signal lines (source/drain interconnections) 34 are arranged so as to intersect the scanning lines 25 with the gate insulator 27 interposing between them. A part of the signal lines 34 functions as a source electrode 28 of the thin-film transistor. Adjacent to the gate insulator 27 are sequentially arranged an amorphous silicon channel film (active semiconductor film) 33, signal lines (source/drain interconnections) 34, and a silicon nitride interlayer dielectric film (protecting film) 30. A liquid crystal panel of this type is generally called as a bottom gate type panel.

The amorphous silicon channel film 33 includes a doped layer (n layer) doped with phosphorus (P), and an intrinsic layer (i layer, also called as an undoped layer). On the gate insulator 27 is a pixel region, in which the transparent picture electrode 5 is arranged. The transparent picture electrode 5 is made from, for example, an ITO film containing $In_2O_3$ and SnO. A drain electrode 29 of the thin-film transistor is in contact with and electrically connected to the transparent picture electrode 5 with the interposition of an after-mentioned barrier metal layer.

When a gate voltage is fed to the gate electrode 26 through the scanning line 25, the thin-film transistor 4 is turned on. In this state, a drive voltage which has been fed to the signal line 34 is fed from the source electrode 28 through the drain electrode 29 to the transparent picture electrode 5. When the transparent picture electrode 5 is fed with the drive voltage at a predetermined level, a potential difference occurs between the transparent picture electrode 5 and the counter electrode 2, as described above with reference to FIG. 1. This potential difference orients or aligns the liquid crystal molecules in the liquid crystal layer 3, thereby bringing about light modulation.

In the thin-film transistor substrate 1, the source/drain interconnections 34 electrically connected to the source/drain electrodes; signal lines electrically connected to the transparent picture electrode 5 (signal lines for picture electrode); and scanning lines 25 electrically connected to the gate electrode 26 are each made from a thin film of pure alloy or an aluminum alloy such as Al—Nd (hereinafter pure aluminum and such aluminum alloys are generically referred to as "aluminum alloys"). This is because such pure aluminum or aluminum alloys have a low resistivity and can be easily processed. Barrier metal layers 51, 52, 53, and 54 containing a refractory metal such as Mo, Cr, Ti, or W are arranged on and/or below these interconnections, as illustrated in FIG. 2. A representative example of such an interconnection is a multilayer (three-layer) interconnection including a molybdenum (Mo) layer (lower barrier metal layer) about 50 nm thick, a pure aluminum or Al—Nd alloy thin film about 150 nm thick, and a Mo layer (upper barrier metal layer) about 50 nm thick arranged in this order.

Reasons why the three-layered multilayer interconnection is used as the source/drain interconnections 34 connected to the channel amorphous silicon thin film 33 will be described below.

As is illustrated in FIG. 2, the lower barrier metal layer 53 is arranged between the channel amorphous silicon thin film 33 and the aluminum alloy thin film. This configuration is mainly intended to prevent the interdiffusion between silicon and aluminum at the interface between the aluminum alloy thin film and the channel amorphous silicon thin film (hereinafter also simply referred to as "interface").

If an aluminum alloy is brought into direct contact with a channel amorphous silicon thin film, and a heat treatment such as sintering or annealing is conducted in a subsequent step in the production of thin-film transistors, aluminum in the aluminum alloy diffuses into the amorphous silicon and/or silicon in the amorphous silicon diffuses into the aluminum alloy. Consequently, the performance of the amorphous silicon as a semiconductor significantly deteriorates, resulting in a decreased ON-state current, an increased leak current flowing when the thin-film transistor is turned off (OFF-state current), and/or a decreased switching speed of the thin-film transistor. Thus, desired thin-film transistor properties cannot be obtained, and the resulting display device has poor performance and quality. The lower barrier metal layer 53 effectively prevents the interdiffusion between aluminum and silicon.

The upper barrier metal layer 54 is arranged on or above the aluminum alloy thin film mainly to prevent the formation of hillocks (nodular projections) on the surface of the aluminum alloy thin film and to ensure a contact with an ITO layer to be arranged thereon. The hillock is probably formed as a result of heat treatment generally at about 300° C. to about 400° C. This heat treatment is carried out in the deposition of a silicon nitride film (protecting film) after the deposition of the aluminum alloy thin film in manufacturing processes of the thin-film transistor substrate. Specifically, the substrate bearing the aluminum alloy thin film is subjected typically to chemical vapor deposition (CVD) to thereby deposit a silicon nitride film (protecting film). The hillocks are probably caused by a difference in thermal expansion between the aluminum alloy thin film and the glass substrate in this process. The upper barrier metal layer 54 effectively prevents the formation of hillocks.

The formation of upper and lower barrier metal layers, however, requires an extra film-deposition system for the deposition thereof, in addition to a film-deposition system for the deposition of aluminum alloy interconnections. Specifically, a film-deposition system including extra film-deposition chambers for the deposition of respective barrier metal thin films must be used. A representative example of the system is a cluster tool system including multiple film-deposition chambers connected to a transfer chamber. The system including extra units for the deposition of barrier metal layers causes an increased production cost and a reduced productivity, which must be avoided in mass-production of liquid crystal panels at low cost.

The aluminum alloy thin film is connected to the transparent picture electrode 5 with the interposition of the barrier metal layer 51 as illustrated in FIG. 2. If an aluminum alloy thin film is directly connected to the transparent picture electrode, the contact resistance between these components is high, which impairs the quality of displayed images. Aluminum used as a material for the interconnections for the transparent picture electrode is very susceptible to oxidation. Consequently, an insulating layer of an aluminum oxide is formed at the interface between the aluminum alloy thin film and the transparent picture electrode. The aluminum oxide is caused by oxygen formed or added during film-deposition processes of the liquid crystal panel. The indium tin oxide (ITO) as a material for the transparent picture electrode is an electrically conductive metal oxide, but it fails to establish an electrically ohmic contact if an aluminum oxide layer is formed as mentioned above.

The deposition of such barrier metal layers, however, requires extra film-deposition chambers for the deposition thereof, in addition to sputtering systems for the deposition of the gate electrode, source electrode, and drain electrode. These extra units cause an increased production cost and a decreased productivity.

In addition, metals used as the barrier metal layers are processed in processing such as wet etching with a chemical solution at different rates from those of pure aluminum and aluminum alloys. Thus, processing dimensions in transverse or crosswise direction in the processing cannot be significantly controlled. Accordingly, the deposition of barrier metal layers requires complicated processes and thereby causes an increased production cost and a decreased productivity, not only from the viewpoint of film-deposition but also from the viewpoint of processing.

Accordingly, proposals on materials for electrodes that eliminate the necessity for barrier metal layers and enable direct contact between source/drain electrodes and a transparent picture electrode and on materials for electrodes that enable direct contact between source/drain electrodes and semiconductor layers such as a channel amorphous silicon thin film have been made.

Japanese Unexamined Patent Application Publication (JP-A) No. Hei 11-337976 discloses a technique of using an indium zinc oxide (IZO) film containing indium oxide and about 10 percent by mass of zinc oxide as the material for the transparent picture electrode. According to this technique, however, the ITO film that is most widely used must be replaced with the IZO film, which causes an increased material cost.

JP-A No. Hei 11-283934 discloses a method of modifying the surface of a drain electrode by subjecting the drain electrode to plasma treatment or ion implantation. The method, however, requires an extra step for the surface treatment, which causes a decreased productivity.

JP-A No. Hei 11-284195 discloses a method of constructing the gate electrode, source electrode, and drain electrode from a first layer of pure aluminum or an aluminum alloy, and a second layer of pure aluminum or an aluminum alloy further containing impurities such as nitrogen, oxygen, silicon, and carbon. This method is advantageous in that thin films for constituting the gate electrode, source electrode, and drain electrode can be continuously deposited in one film-deposition chamber. This method, however, requires an extra step of depositing the second layer containing impurities. In addition, the resulting source/drain interconnections frequently delaminate from the wall of the chamber in the step of introducing impurities into the source/drain interconnections. This is caused by a difference in thermal expansion coefficient between a film containing the impurities and a film not containing the impurities. To avoid this problem, the method requires frequent maintenance operations while stopping the film-deposition step, and this results in a significantly decreased productivity.

Under these circumstances, the present inventors have disclosed a method that eliminates the necessity of barrier metal layers, simplifies the manufacturing process without increasing the number of steps, and enables direct and reliable contact between the aluminum alloy film and the transparent picture electrode in JP-A No. 2004-214606. The technique disclosed in JP-A No. 2004-214606 uses an aluminum alloy containing 0.1 to 6 atomic percent of at least one selected from the group consisting of Au, Ag, Zn, Cu, nickel, Sr, Ge, Sm, and Bi as an alloy element, and allowing at least part of these alloy elements to be a precipitated or enriched layer at the interface between the aluminum alloy film and the transparent picture electrode to thereby achieve the object.

JP-A No. 2003-273109 discloses a thin film for the three-layered aluminum alloy interconnection, which includes an electrically conductive upper aluminum nitride layer (AlN layer), an aluminum alloy thin film, and an electrically conductive lower aluminum nitride layer arranged in this order. The upper aluminum nitride layer can be directly connected to the ITO film and realizes a satisfactorily low contact resistance. The lower aluminum nitride layer can be directly connected to semiconductor layers such as an amorphous silicon layer and establishes an excellent Ohmic contact. This method, however, requires a highly sophisticated control in sputtering, because sputtering must be conducted while appropriately controlling the composition and proportion of reaction gases in order to deposit the aluminum nitride layers. In addition, the method is still susceptible to improvements in contact resistance and Ohmic contact, and a demand has been made on further improvements.

The above explanation has been made by taking a liquid crystal display device as a representative example, but the problems in the conventional techniques are in common in amorphous silicon thin-film transistor substrates used not only in liquid crystal display devices but also in other devices. These problems also occur in thin-film transistor substrates using a polycrystalline silicon instead of an amorphous silicon as the semiconductor layer of thin-film transistors.

SUMMARY OF THE INVENTION

The present invention has been accomplished under these circumstances, and an object of the present invention is to provide a technique that gives excellent thin-film transistor properties even without lower barrier metal layer and permits direct and reliable connection between source/drain interconnections and semiconductor layers of thin-film transistors.

Another object of the present invention is to provide a technique that ensures excellent thin-film transistor properties, high thermal stability, and low contact resistivity without lower and upper barrier metal layers and permits direct and reliable connection of source/drain interconnections not only to semiconductor layers of thin-film transistors but also to transparent picture electrodes.

To achieve the above objects, the present invention provides a source/drain electrode for use in a thin-film transistor substrate comprising a substrate, a thin-film transistor semiconductor layer, source/drain electrodes, and a transparent picture electrode, the source/drain electrode including a nitrogen-containing layer and a thin film of pure aluminum or an aluminum alloy, in which the source/drain electrode is so configured that nitrogen of the nitrogen-containing layer binds to silicon of the thin-film transistor semiconductor layer, and the source/drain electrode is so configured that the thin film of pure aluminum or aluminum alloy is connected to the thin-film transistor semiconductor layer through the nitrogen-containing layer.

In a preferred embodiment, the nitrogen-containing layer mainly contains a silicon nitride.

The nitrogen-containing layer in another preferred embodiment contains a silicon oxynitride.

The nitrogen-containing layer preferably has a surface density of nitrogen atoms (N1) of $10^{14}$ cm$^{-2}$ or more and $2\times10^{16}$ cm$^{-2}$ or less.

The nitrogen-containing layer has a surface density of oxygen atoms (O1), in which the ratio of N1 to O1 (N1/O1) is preferably 1.0 or more.

The nitrogen-containing layer preferably has a surface density of nitrogen atoms equal to or higher than the surface density of silicon effective dangling bonds constituting the semiconductor layer.

The nitrogen-containing layer preferably has a thickness within the range of 0.18 nm or more and 20 nm or less.

In still another preferred embodiment, the nitrogen-containing layer has a number of nitrogen atoms (N) and a number of silicon atoms (Si), in which the maximum ratio of N to Si (N/Si) is within the range of 0.5 or more and 1.5 or less.

The thin-film transistor semiconductor layer preferably contains an amorphous silicon or a polycrystalline silicon.

The aluminum alloy preferably contains 6 atomic percent or less of Ni (nickel) as an alloy element.

In another preferred embodiment, the thin film of pure aluminum or aluminum alloy is a thin film of an aluminum alloy, the aluminum alloy contains 0.3 atomic percent or more and 6 atomic percent or less of nickel (Ni) as an alloy element, and the source/drain electrode is so configured that the thin film of aluminum alloy is further directly connected to the transparent picture electrode.

The aluminum alloy can further contain 0.1 atomic percent or more and 1.0 atomic percent or less of at least one element selected from the group consisting of Ti, V, Zr, Nb, Mo, Hf, Ta, and W as an alloy element.

The aluminum alloy in yet another embodiment may further contain 0.1 atomic percent or more and 2.0 atomic percent or less of at least one element selected from the group consisting of Mg, Cr, Mn, Ru, Rh, Pd, Ir, Pt, La, Gd, Tb, Dy, Nd, Y, Co, and Fe as an alloy element.

The present invention further provides a thin-film transistor substrate including the source/drain electrodes.

The present invention further provides a display device including the thin-film transistor substrate.

In addition and advantageously, the present invention provides a method for manufacturing the thin-film transistor substrate, including the steps of (a) depositing a semiconductor layer on or above a substrate to prepare a thin-film transistor substrate; (b) forming a nitrogen-containing layer on the semiconductor layer; and (c) depositing a layer of pure aluminum or aluminum alloy on the nitrogen-containing layer.

In a preferred embodiment, the semiconductor layer is deposited in a deposition system in the step (a), and the step (b) is carried out in the same deposition system.

In another preferred embodiment, the semiconductor layer is deposited in a chamber in the step (a), and the step (b) is carried out in the same chamber.

In yet another embodiment, the semiconductor layer is deposited at a deposition temperature in the step (a), and the step (b) is carried out at a temperature substantially the same as the deposition temperature.

In another preferred embodiment, the semiconductor layer is deposited using a gas in the step (a), and the step (b) is carried out in an atmosphere of a mixture of the gas and a nitrogen-containing gas.

In yet another embodiment, the step (b) is carried out in an atmosphere of a mixture of a nitrogen-containing gas and a reducing gas.

The step (b) is preferably carried out by a plasma nitridation process.

The plasma nitridation process is preferably carried out at a pressure of 55 Pa or more.

The plasma nitridation process is preferably carried out at temperatures of 300° C. or higher.

The plasma nitridation process is preferably carried out in an atmosphere of a mixture of a nitrogen-containing gas and a reducing gas.

The plasma nitridation process in the step (b) is preferably carried out in an atmosphere of a mixture of a nitrogen-containing gas and a gas used in the step (a).

In another preferred embodiment, the step (b) is carried out by a thermal nitridation process.

The thermal nitridation process is preferably carried out at temperatures of 400° C. or lower.

The step (b) can be carried out by an amination process.

The amination process preferably uses ultraviolet radiation.

The amination process preferably uses solution which contains nitrogen.

The step (c) can be carried out by a sputtering process.

The source/drain electrodes according to the present invention have the above configuration, can use a generally used pure aluminum or aluminum alloy. In addition, they can be connected to semiconductor layers of thin-film transistors through the nitrogen-containing layer without barrier metal layers, in contrast to conventional equivalents. The source/drain electrodes have good thin-film transistor properties.

By further using an Al—Ni alloy containing a specific amount of nickel as the aluminum alloy, the source/drain electrodes according to the present invention can be directly connected not only to semiconductor layers of thin-film transistors but also to transparent picture electrodes. The resulting source/drain electrodes are excellent in thin-film transistor properties, contact resistivity, and thermal stability.

The use of the source/drain electrodes according to the present invention provides high-performance display devices that can be produced with excellent productivity at low cost.

Further objects, features and advantages of the present invention will become apparent from the following description of the preferred embodiments with reference to the attached drawings.

DESCRIPTION OF THE PREFERRED EMBODIMENTS

Figure 1:
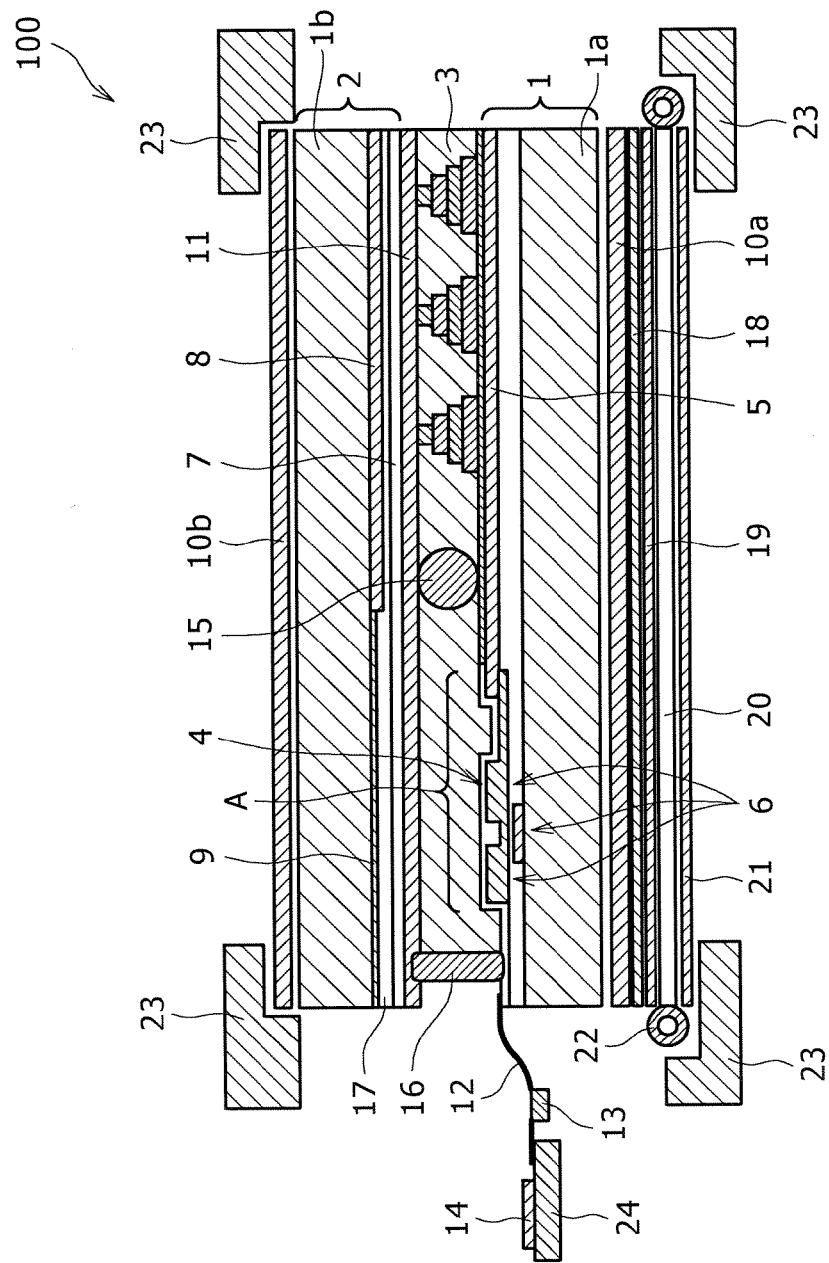
FIG. 1 is a schematic enlarged sectional view illustrating the configuration of a representative liquid crystal panel to which an amorphous silicon thin-film transistor substrate is applied.

The present inventors made intensive investigations to provide novel source/drain electrodes to be connected to semiconductor layers of thin-film transistors. Specifically, they made investigations to provide novel source/drain electrodes that can exhibit excellent thin-film transistor properties, when connected to semiconductor layers without the interposition of barrier metal layers, in contrast to conventional equivalents, and can use pure aluminum or aluminum alloys (hereinafter these conventional aluminum materials are generically referred to as "aluminum alloys") as intact, which aluminum alloys are generally conventionally used as materials for source/drain electrode interconnections. Consequently, they have found that the objects can be achieved by constructing a source/drain electrode arranged adjacent to a semiconductor layer from a nitrogen-containing layer and an aluminum alloy thin film, in which nitrogen (N) of the nitrogen-containing layer binds to silicon (Si) of the semiconductor layer. The present invention has been achieved based on these findings. This configuration permits direct connection between the aluminum alloy thin film and the semiconductor layer of thin-film transistor through the nitrogen-containing layer.

By using an aluminum alloy further comprising 0.3 to 6 atomic percent of nickel (hereinafter also referred to as "Al—Ni alloy" so as to distinguish from conventional aluminum alloys) as the aluminum alloy, the Al—Ni alloy thin film can be directly connected to the transparent picture electrode. This provides source/drain electrodes having good electrical properties without barrier metal layers, in contrast to conventional equivalents.

The term "source/drain electrode" used herein means and includes both a source/drain electrode itself and a source/drain interconnection. Specifically, the source/drain electrodes according to the present invention each comprise a source/drain electrode integrated with a source/drain interconnection, in which the source/drain interconnection is in contact with a source/drain region.

The source/drain electrodes according to the present invention will be illustrated in detail below. For the sake of convenience in explanation, the source/drain electrodes are categorized and distinguished into "source/drain electrodes according to First Embodiment" and "source/drain electrodes according to Second Embodiment". The source/drain electrodes according to First Embodiment can be connected to semiconductor layers of thin-film transistors without the interposition of barrier metal layers, and the source/drain electrodes according to Second Embodiment can be connected to semiconductor layers of thin-film transistors without the interposition of barrier metal layers and can further be directly connected to the transparent picture electrode. The source/drain electrodes according to Second Embodiment have the same configuration as the source/drain electrodes according to First Embodiment, except for the composition of aluminum material.

Source/Drain Electrodes According to First Embodiment

The source/drain electrodes according to First Embodiment each comprise a nitrogen-containing layer and an aluminum alloy thin film. The nitrogen-containing layer is arranged so as to cover a thin-film transistor semiconductor layer, and nitrogen (N) of the nitrogen-containing layer binds to silicon of the semiconductor layer. The nitrogen-containing layer acts as a barrier for preventing interdiffusion between aluminum and silicon at the interface between the aluminum alloy thin film and the thin-film transistor semiconductor layer. The source/drain electrodes according to First Embodiment therefore provide excellent thin-film transistor properties without barrier metal layers typically of molybdenum (Mo), in contrast to conventional equivalents, as demonstrated in after-mentioned Experimental Examples. This configuration eliminates the need of an extra film-deposition system for the deposition of barrier metals, because the nitrogen-containing layer can be easily formed, for example, by a plasma nitridation process after the deposition of the semiconductor layer and before the deposition of the aluminum alloy layer.

The nitrogen-containing layer featuring in the present invention will be illustrated in detail below.

Nitrogen (N) of the nitrogen-containing layer binds to silicon of the semiconductor layer, and the nitrogen-containing layer thereby mainly comprises a silicon nitride, as described above. This layer can further comprise a silicon oxynitride. The silicon oxynitride is formed as a result of the binding of silicon nitride with oxygen (O) which is, for example, inevitably introduced during the deposition process of the nitrogen-containing layer.

The nitrogen-containing layer preferably further satisfies the following requirements, as demonstrated in after-mentioned Experimental Examples.

The nitrogen-containing layer preferably has a surface density of nitrogen equal to or higher than the surface density of effective dangling bonds of the material (typified by silicon) of the semiconductor layer of thin-film transistor. As is described above, the surface of the semiconductor layer must be covered by the nitrogen-containing layer so as to prevent the interdiffusion between the metal interconnection material and the semiconductor material. In this case, unbounded bonds (dangling bonds) at the surface of semiconductor layer preferably combine with nitrogen. The term "effective dangling bond" herein means a bond that can be present in the surface of the semiconductor layer even in consideration of steric hindrance of nitrogen atom. The term "surface density of effective dangling bond" means the surface density assuming that the nitrogen-containing layer covers the entire surface of the semiconductor layer. The surface density of effective dangling bond varies depending on the type of the semiconductor material. It is substantially within the range of about $10^{14}$ cm$^{-2}$ to $10^{15}$ cm$^{-2}$ in the case of silicon, while slightly varying depending on the plane direction of crystal.

Specifically, the nitrogen-containing layer preferably has a surface density of nitrogen (N1) of $10^{14}$ cm$^{-2}$ or more and $2 \times 10^{16}$ cm$^{-2}$ or less at the interface between the thin film of pure aluminum or an aluminum alloy and the semiconductor layer both in the cases when the nitrogen-containing layer mainly comprises a silicon nitride and when it further comprises a silicon oxynitride in addition to the main component silicon nitride. To ensure desired thin-film transistor properties, the surface density of nitrogen (N1) of the nitrogen-containing layer is more preferably $2 \times 10^{14}$ cm$^{-2}$ or more and further preferably $4 \times 10^{14}$ cm$^{-2}$ or more. However, an excessively high surface density of nitrogen (N1) of the nitrogen-containing layer may result in an increased amount of insulative silicon nitride in the nitrogen-containing layer. This causes an increased electrical resistance and thereby deteriorated thin-film transistor properties. The upper limit of the surface density of nitrogen (N1) is more preferably set at $1 \times 10^{16}$ cm$^{-2}$.

When the nitrogen-containing layer comprises a silicon oxynitride, namely, when it further comprises a silicon oxide in addition to a silicon nitride, the ratio (N1/O1) of the surface density of nitrogen surface density of nitrogen (N1) to the surface density of oxygen (O1) is preferably 1.0 or more, in addition to meeting the requirement in surface density of nitrogen (N1). This further improves the thin-film transistor properties. The silicon nitride and silicon oxynitride are primarily insulators, but the electrical resistance in these configurations can be low, because the nitrogen-containing layer has a very small thickness of, for example, 0.18 nm or more and 20 nm or less, as described later.

The present inventors have experimentally found that the thin-film transistor properties are affected by the ratio N1/O1, and the ratio N1/O1 should preferably be 1.0 or more for providing further excellent thin-film transistor properties, as demonstrated in after-mentioned Experimental Examples. This is probably because resistive components in the nitrogen-containing layer decreases at a high ratio N1/O1 to thereby yield satisfactory properties as thin-film transistor. The ratio N1/O1 is preferably high as much as possible, and it is more preferably 1.05 or more and further preferably 1.1 or more.

The ratio N1/O1 can be adjusted, for example, by appropriately controlling conditions for plasma generation, such as gas pressure and gas composition for plasma, and process temperature, in the formation of the nitrogen-containing layer using a plasma nitridation process. This will be illustrated in detail later.

The surface density of nitrogen (N1) and the surface density of nitrogen (O1) of the nitrogen-containing layer can be determined, for example, by Rutherford backscattering spectrometry (RBS).

The nitrogen-containing layer preferably has a thickness of 0.18 nm or more and 20 nm or less. As is described above, the nitrogen-containing layer is effective as a barrier layer for preventing the interdiffusion between aluminum and silicon at the interface between the aluminum alloy layer and the thin-film transistor semiconductor layer, but an excessively thick nitrogen-containing layer may impair the performance of the thin-film transistor. The increase in electrical resistance due to the presence of the nitrogen-containing layer can be controlled within such a range as not to adversely affect the performance of TFT by controlling the thickness of the nitrogen-containing layer within the above-specified range. The thickness of the nitrogen-containing layer is more preferably 15 nm or less and further preferably 10 nm or less. Over one monolayer of silicon-nitrogen bond is enough for the nitrogen-containing layer at minimum. The atomic distance of silicon-nitrogen is about 0.18 nm, thus, the minimum thickness of the nitrogen-containing layer is preferably 0.18 nm or more. The thickness of the nitrogen-containing layer is more preferably 0.2 nm and further preferably 0.4 nm. The thickness of the nitrogen-containing layer can be determined by a variety of physical analyzing procedures such as above-mentioned RBS process, an X-ray photoelectron spectrometry (XPS), secondary ion mass spectrometry (SIMS), and an RF glow discharge emission spectrometry (GD-OES). The thickness of the nitrogen-containing layer is determined by RBS and XPS in after-mentioned Experimental Examples.

In the nitrogen-containing layer, the maximum of the ratio (N/Si) of the number of nitrogen atoms to the number of silicon atoms is preferably 0.5 or more and 1.5 or less. This permits the nitrogen-containing layer to effectively act as a barrier without deterioration in thin-film transistor properties. The ratio N/Si is more preferably 0.6 or more and further preferably 0.7 or more.

The ratio N/Si can be adjusted, for example, by controlling the irradiation time of plasma within the range of about 1 minute to about 10 minutes. This will be illustrated in detail later.

The ratio N/Si can be determined, for example, by analyzing these elements (nitrogen and silicon) in a thickness direction of the nitrogen-containing layer according to RBS.

The nitrogen-containing layer is formed, for example, by subjecting the uppermost layer of the semiconductor layer to nitridation. The nitridation process is not specifically limited and includes, for example, (i) a plasma nitridation process, (ii) a thermal nitridation process, and (iii) an amination process, as described in detail below.

(i) Plasma Nitridation Process

The plasma nitridation process uses plasma. This process preferably uses a nitrogen-containing gas as demonstrated in after-mentioned Embodiment 1 and Experimental Example 1. The nitrogen-containing gas can be a non-oxidative gas such as $N_2$, $NH_3$, or $NF_3$. Each of these gases can be used alone or in combination as a gaseous mixture. If an oxidative gas such as $N_2O$ gas is used, the reaction between oxygen (O) in the oxidative gas and silicon proceeds prior to the reaction between nitrogen and silicon to thereby fail to form a desired silicon nitride layer, because silicon in the surface of the semiconductor layer is very susceptible to oxidation. Specifically, the thin-film transistor semiconductor layer is preferably placed in the vicinity of a plasma source containing nitrogen. The distance between the plasma source and semiconductor layer may be set within an appropriate range according to the type of plasma and conditions for the generation of plasma, such as power, pressure, temperature, and gas composition. It is preferably about several tens of centimeters or less. High-energy nitrogen atoms are present in such a vicinity of plasma, and they can easily form a desired nitrogen-containing layer on the surface of the semiconductor layer.

Nitrogen can be fed from the nitrogen-containing plasma source, for example, by ion implantation. In this case, the distance between the plasma source and the semiconductor layer can be arbitrarily set, because ions accelerated by an electrical field can travel a long distance. The ion implantation is preferably carried out by placing the semiconductor layer in the vicinity of the plasma source and applying a negative high-voltage pulse to the semiconductor layer so as to implant ions to the entire surface of the semiconductor layer. Alternatively, an dedicated ion implanter can be used to carry out ion implantation.

The plasma generation conditions such as pressure and composition of gas for the generation of plasma, and process temperature are preferably controlled in the following manner so as to set the ratio (N1/01) of the surface density of nitrogen (N1) to the surface density of oxygen (01) in the nitrogen-containing layer at 1.0 or more to thereby further improve the thin-film transistor properties, as demonstrated in after-mentioned Experimental Examples. This effectively prevents the oxidation of the semiconductor layer, accelerates the nitridation reaction, and increases the nitridation efficiency.

Specifically, the reaction pressure is preferably 55 Pa or more. If the pressure is less than 55 Pa, the nitridation reaction may proceed slowly, and it takes a long time to form a nitrogen-containing layer that can effectively act as a diffusion barrier. In addition, an oxidation reaction may significantly proceed prior to the nitridation reaction, which causes deteriorated thin-film transistor properties. From this viewpoint, the pressure is preferably as high as possible, and is more preferably 60 Pa or more and further preferably 66 Pa or more. The upper limit of the pressure varies depending typically on the performance of a system or unit to be used and cannot be uniquely determined. From the view point of stable supply of plasma, the pressure is preferably about 400 Pa or less, and more preferably about 266 Pa or less. For example, the upper limit of the pressure for stably supplying plasma is 133 Pa in the system used in after-mentioned Experimental Example 11.

The reaction temperature is preferably 300° C. or higher. If the reaction temperature is lower than 300° C., the nitridation reaction may proceed slowly, and it takes a long time to form a nitrogen-containing layer that can effectively act as diffusion barrier. In addition, an oxidation reaction may significantly proceed prior to the nitridation reaction, which causes deteriorated thin-film transistor properties. However, an excessively high reaction temperature may invite deterioration and damage of the semiconductor layer, and the reaction temperature is preferably about 360° C. or lower.

The gas for use herein can be the nitrogen-containing gas such as $N_2$, $NH_3$, or $NF_3$ alone but is preferably a mixture of the nitrogen-containing gas with a reducing gas. This further effectively prevents the oxidation of the semiconductor layer. Examples of the reducing gas are $NH_3$ and $H_2$. Of these gases, $NH_3$ acts not only as a reducing gas but also as a nitrogen-containing gas, and it can be used alone or in combination with, for example, $H_2$.

Alternatively, the gas for plasma nitridation is preferably a gaseous mixture of the nitrogen-containing gas with a material gas ($SiH_4$) used in the deposition of the semiconductor layer. When the nitrogen-containing layer is to be formed by using the nitrogen-containing gas alone, the gas used for the deposition of the semiconductor layer must be purged from the chamber after the deposition of the semiconductor layer. The plasma nitridation in an atmosphere of the gaseous mixture eliminates the need of purging the gas for the deposition of the semiconductor layer, which shortens the treatment time.

(ii) Thermal Nitridation Process

The thermal nitridation process has been generally used for nitridation because typically of good throwing power of the resulting film. Specifically, heating is preferably carried out, for example, at temperatures of 400° C. or lower in a nitrogen gas atmosphere, as demonstrated in after-mentioned Experimental Example 2. An excessively high heating temperature may cause increased damage on the semiconductor layer. In contrast, an excessively low heating temperature may fail to provide a desired nitrogen-containing layer sufficiently. The heating temperature is more preferably controlled at 200° C. or higher and 380° C. or lower, and further preferably at 250° C. or higher and 350° C. or lower. The heating treatment (thermal nitridation process) can be conducted in combination with the plasma nitridation process, as described in after-mentioned Experimental Example 3. This further accelerates the formation of the nitrogen-containing layer.

(iii) Amination Process

The amination process serves to accelerate the decomposition or reaction of gas by the action of light to thereby form the nitrogen-containing layer. Light at a wavelength within the ultraviolet region (about 200 nm to 400 nm) is generally used. The light source can be a mercury lamp such as a low-pressure mercury lamp at a wavelength of 254 nm or a high-pressure mercury lamp at a wavelength of 365 nm; or excimer laser system such as ArF laser at a wavelength of 194 nm or KrF laser at a wavelength of 248 nm. More specifically, the amination is preferably carried out using ultraviolet radiation at a shorter wavelength in a nitrogen-containing gas, as demonstrated in after-mentioned Experimental Example 4. This realizes a higher energy to be applied in amidation.

The amination process is preferably carried out using a nitrogen-containing solution typically containing an amino group. Nitrogen can be more efficiently fed to the semiconductor layer by applying ultraviolet radiation while brining the nitrogen-containing liquid in contact with the semiconductor layer. The specific procedure can be found in after-mentioned Experimental Example 4.

As is described above, the nitrogen-containing layer is deposited preferably by at least one of the processes (i) to (iii). The system (device), chamber, temperature, and gas composition for the deposition of the nitrogen-containing layer are preferably set or selected as follows, so as to simplify the manufacturing processes and shorten the treatment time.

Regarding the system, the formation of the nitrogen-containing layer is preferably carried out in the same system as the deposition system for depositing the semiconductor layer, and is more preferably carried out in the same chamber of the same system as the deposition of the semiconductor layer, so as to simplify the manufacturing processes. This eliminates an extra movement of the work between systems or within one system.

Regarding the temperature, the formation of the nitrogen-containing layer is preferably carried out at a substantially equal temperature to the film-deposition temperature of the semiconductor layer, that is, within ±10° C. of the film-deposition temperature of the semiconductor layer. This saves an extra time for adjusting the temperature.

The gas for use herein can be the nitrogen-containing gas such as $N_2$, $NH_3$, or $NF_3$ alone, but is preferably a gaseous mixture of the nitrogen-containing gas with a material gas ($SiH_4$) used for the deposition of the semiconductor layer. When the nitrogen-containing layer is to be formed by using the nitrogen-containing gas alone, the gas used for the deposition of the semiconductor layer must be purged from the chamber after the deposition of the semiconductor layer. The nitridation in an atmosphere of the gaseous mixture eliminates the need of purging the gas for the deposition of the semiconductor layer and shortens the treatment time.

Alternatively, the gas is preferably a mixture of the nitrogen-containing gas with a reducing gas. This further effectively prevents the oxidation of the semiconductor layer. Examples of the reducing gas are $NH_3$ and $H_2$. Of these gases, $NH_3$ acts not only as a reducing gas but also as a nitrogen-containing gas, and it can be used alone or in combination with, for example, $H_2$.

After forming the nitrogen-containing layer on the thin-film transistor semiconductor layer, a film of an aluminum alloy is deposited typically by a sputtering process to thereby yield a desired source/drain interconnection. The source/drain electrode according to the present invention can be deposited by using a single sputtering target and a single sputtering gas, and there is no need of changing the composition of the sputtering gas as in above-mentioned JP-A No. 2003-273109. Accordingly, the present invention can further simplify the manufacturing processes.

One of the major features of the source/drain electrodes according to the present invention is the nitrogen-containing layer arranged between the thin-film transistor semiconductor layer and the aluminum alloy layer so as to cover the semiconductor layer. Accordingly, the types of the aluminum alloy and the semiconductor layer are not specifically limited, and those generally used in source/drain electrodes can be used, as long as the thin-film transistor properties are not adversely affected. Representative examples of the semiconductor layer are an amorphous silicon and a polycrystalline silicon. The aluminum alloy can be, for example, a generally-used aluminum material such as pure aluminum or an aluminum alloy containing silicon, copper, or a rare-earth element such as Nd or Y as an alloy element.

The aluminum material for interconnections in the source/drain electrodes according to First Embodiment can be a conventional aluminum alloy as intact but is preferably an Al—Ni alloy containing 6 atomic percent or less of nickel, as is described above. This configuration also realizes thin-film transistor properties equivalent to those of conventional aluminum alloys, even the resulting thin-film transistor substrate does uses no barrier metal layer. This will be demonstrated in after-mentioned Experimental Examples. If the Al—Ni alloy contains more than 6 atomic percent of nickel, the Al—Ni alloy thin film may have an excessively high electrical resistance. Thus, the response speed of pixel may decrease, the power consumption may increase, and the resulting display may have impaired quality not suitable for practical use. The nickel content is more preferably 5 atomic percent or less. The lower limit of the nickel content is not specifically limited in view of the thin-film transistor properties. However, when the Al—Ni alloy thin film is directly connected to an ITO thin film, the Ni—Al alloy preferably contains 0.3 atomic percent or more of nickel.

The Al—Ni alloy for use in the present invention can further comprise, as a third component, 0.1 atomic percent or more and 1.0 atomic percent or less of at least one element selected from the group consisting of Ti, V, Zr, Nb, Mo, Hf, Ta, and W (this group is hereinafter also referred to as "Group X1"). The resulting alloy is hereinafter also referred to as "Al—Ni—X1 alloy". Alternatively or in addition, the Al—Ni alloy can further comprise 0.1 atomic percent or more and 2.0 atomic percent or less of at least one element selected from the group consisting of Mg, Cr, Mn, Ru, Rh, Pd, Ir, Pt, La, Gd, Tb, Dy, Nd, Y, Co, and Fe (this group is hereinafter also referred to as "Group X2"). The resulting alloy is hereinafter also referred to as "Al—Ni—X2 alloy". An Al—Ni—X1-X2 alloy containing at least one element belonging to Group X1 and at least one element belonging to Group X2 can be used in the present invention.

At least one of the elements belonging to Group X1 and Group X2, if incorporated into the Al—Ni alloy, serves to prevent decrease in thermal stability due to formation of hillocks (bumpy projections) on the surface of the Al—Ni alloy thin film when the Al—Ni alloy thin film is brought into direct contact with the ITO film. Groups X1 and X2 differ from each other in their operations when viewed in detail. These differences including preferred contents of them will be described in detail in the source/drain electrodes according to Second Embodiment later.

The source/drain electrodes according to First Embodiment eliminate the need of the interposition of a lower barrier metal layer between the aluminum alloy thin film and the thin-film transistor semiconductor layer, in contrast to conventional equivalents. Therefore, the aluminum alloy thin film can be in direct contact with the semiconductor layer through the nitrogen-containing layer. Sample TFTs using a thin film of pure aluminum or an Al—Ni alloy prepared in after-mentioned Experimental Examples were found to realize thin-film transistor properties equal to or higher than those of conventional equivalents using a conventional aluminum alloy thin film with the interposition of a barrier metal layer such as chromium layer. Thus, the present invention eliminates the need of barrier metal layer, thereby simplify manufacturing processes and reduces the production cost.

Source/Drain Electrodes According to Second Embodiment

The source/drain electrodes according to Second Embodiment each comprise a nitrogen-containing layer and a Al—Ni alloy thin film. The source/drain electrodes according to Second Embodiment have the same configurations as the source/drain electrodes according to First Embodiment, except for using an after-mentioned specific Al—Ni alloy as an aluminum material. Description on the same configurations, such as the nitrogen-containing layer, as the source/drain electrodes according to First Embodiment will be omitted herein.

The specific Al—Ni alloy permits direct connection between the Al—Ni alloy thin film and the thin-film transistor semiconductor layer through the nitrogen-containing layer and, in addition, enables direct connection between the Al—Ni alloy and the transparent picture electrode. This is probably because an electrically conductive oxide (AlOx, 0<x≦0.8) and/or a nickel-enriched layer is formed at the interface between the Al—Ni alloy and the transparent picture electrode. This will be described in detail later.

Initially, the Al—Ni alloy for use in the source/drain electrodes according to Second Embodiment will be described.

The Al—Ni alloy for use herein comprises 0.3 atomic percent or more and 6 atomic percent or less of nickel. The lower limit of the nickel content (0.3 atomic percent) is set mainly from the viewpoints of reducing the contact resistivity at the interface between the Al—Ni alloy thin film and the transparent picture electrode and of ensuring satisfactory thermal stability.

If the nickel content of the source/drain electrodes according to Second Embodiment is less than 0.3 atomic percent, the contact resistivity at the interface slightly increases and the thermal stability decreases. If the nickel content exceeds 6 atomic percent, the Al—Ni alloy thin film may have an excessively high electrical resistance. Thus, the response speed of pixel decreases, the power consumption increases, and the resulting display has impaired quality not suitable for practical use. In consideration of these advantages and disadvantages, the nickel content is preferably 0.5 atomic percent or more and 5 atomic percent or less.

The Al—Ni alloy preferably further comprises, as a third component, 0.1 atomic percent or more and 1.0 atomic percent or less of at least one element belonging to Group X1. If the content of the at least one element belonging to Group X1 is less than 0.1 atomic percent, the activity of these elements may not be effectively exhibited. In contrast, if it exceeds 1.0 atomic percent, the activity may increase but the Al—Ni—X1 alloy thin film may have an increased resistivity. In consideration of these, the content of the at least one element belonging to Group X1 is more preferably 0.2 atomic percent or more and 0.8 atomic percent or less. Each of these elements can be used alone or in combination. When they are used in combination, the total content of the elements should fall within the above-specified range.

Alternatively or in addition, the Al—Ni alloy can further comprise 0.1 atomic percent or more and 2.0 atomic percent or less of at least one element belonging to Group X2 as a third component. This serves to effectively prevent decrease in thermal stability due to formation of hillocks (bumpy projections) on the surface of the Al—Ni alloy thin film, as in the Al—Ni—X1 alloy. If the content of the at least one element belonging to Group X2 is less than 0.1 atomic percent, the activity may not be effectively exhibited. However, if it exceeds 2.0 atomic percent, the resistivity of the Al—Ni—X2 alloy thin film may increase, although the activity may increase. In consideration of these, the content of the at least one element belonging to Group X2 is more preferably 0.3 atomic percent or more and 1.8 atomic percent or less. Each of these elements can be used alone or in combination. When they are used in combination, the total content of the elements should fall within the above-specified range.

The Al—Ni alloy for use in the present invention can be an Al—Ni—X1—X2 alloy comprising both of at least one element belonging to Group X1 and at least one element belonging to Group X2.

These elements belonging to Groups X1 and X2 are selected from the viewpoints of the thermal stability and the electrical resistivity of the resulting Al—Ni—X1 alloy thin film or Al—Ni—X2 alloy thin film. Groups X1 and X2 slightly differ from each other in the mechanism to contribute to thermal stability. This will be illustrated in detail below, with reference to FIG. 8.

Figure 8:
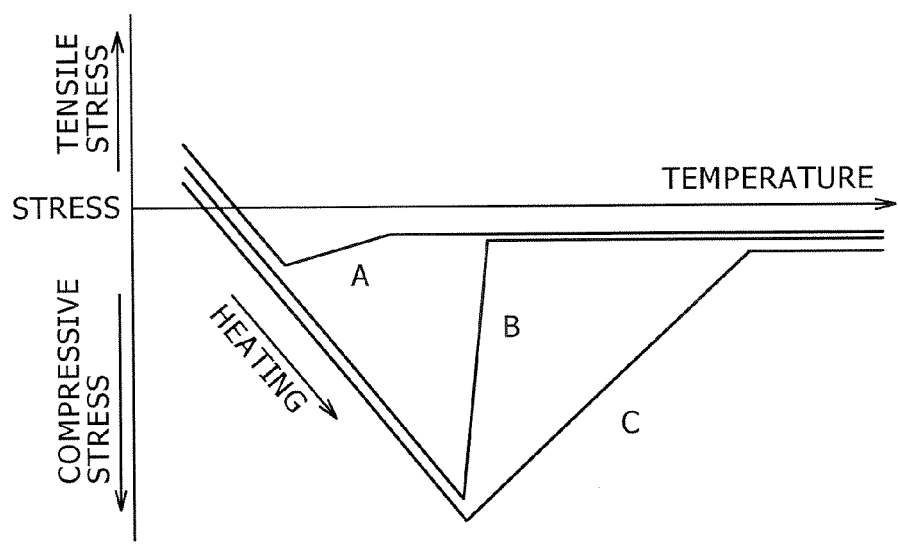
FIG. 8 is diagram showing how the film stress varies depending on the deposition temperature of the aluminum alloy film.

FIG. 8 is a diagram schematically illustrating how the stress of aluminum thin film varies depending on the temperature. In FIG. 8, the symbols "A", "B", and "C" represent the data of pure aluminum, an Al—X2 alloy comprising an element belonging to Group X2, and an Al—X1 alloy comprising an element belonging to Group X1, respectively.

FIG. 8 shows that the Al—X2 alloy film "B" comprising an element belonging to Group X2 has an increasing compressive stress with an elevating temperature. The grain growth is inhibited in early stages of temperature elevation but it initiates at relatively low temperatures, and the stress is sharply relaxed in a narrow range of temperatures. This is probably because a dissolved element contained in the alloy precipitates as an intermetallic compound, and this accelerates the grain growth of aluminum to thereby reduce the electrical resistivity. Specifically, the electrical resistivity is sufficiently reduced at relatively low heating temperatures. However, when the thin film is further heated in the state where the stress is fully relaxed, compressive stress occurs in the thin film, and thereby causes, for example, hillocks. The alloy probably has a heat-resistant temperature near to the temperature at which the stress is relaxed.

The Al—X1 alloy film "C" comprising an element belonging to Group X1 shows an increasing compressive stress with an elevating temperature as in the Al—X2 alloy film "B", and the grain growth of aluminum initiates at similar temperatures as in the Al—X2 alloy film. However, the element belonging to Group X1 diffuses from the solid-solution and precipitates as an intermetallic compound at a relatively low rate. Thus, the intermetallic compound gradually precipitates within a wide range of temperatures, and the stress is gradually relaxed with the precipitation, as illustrated in FIG. 8. Therefore, it requires much heating and quite a long time before the stress is sufficiently relaxed, most of the dissolved element precipitates as an intermetallic compound, and grain growth of aluminum proceeds to allow the film matrix to have a sufficiently reduced electrical conductivity. This results in increased thermal stability. Specifically, the elements belonging to Group X1 may more slowly precipitate as an intermetallic compound, thereby more effectively increase the thermal stability, and can exhibit sufficient advantage of improving the thermal stability in a smaller amount than the elements belonging to Group X2.

Thus, the elements belonging to Group X1 and those belonging to Group X2 differ in mechanism of exhibiting the thermal stability and thereby differ in content (upper limit of the content).

The elements belonging to Group X1 can reduce the contact resistivity to a target level in a smaller amount than the elements belonging to Group X2, as demonstrated in after-mentioned Experimental Examples. This activity is also observed when the thin film is treated at relatively low heating temperatures.

In addition, the elements belonging to Group X1 are resistant to the formation of voids in the electrode film as compared with the elements belonging to Group X2, although the content of the former should be set lower than the content of the latter. Specifically, when an element that rapidly precipitates as an intermetallic compound in a narrow range of temperatures upon heating, such as one belonging to Group X2, is used, a more intensive tensile stress occurs in the film with proceeding grain growth, when the film is cooled to room temperature after heating. The tensile stress may cause voids. In contrast, in an alloy system in which an intermetallic compound gradually precipitates over a long time with an elevating temperature, such as an element belonging to Group X1, the precipitation and grain growth are interrupted when the alloy is heated to temperatures as in Group X2, the stress is not sufficiently relaxed, and a small quantity of the tensile stress remains in the film when cooled to room temperature. Thus, the elements belonging to Group X1 are preferably selected from the viewpoint of preventing voids caused by the tensile stress.

Next, the oxide (AlOx, wherein x satisfies the following condition: $0 < x \leq 0.8$) formed at the interface between the Al—Ni alloy thin film and the transparent picture electrode will be described.

The oxide AlOx contains oxygen in a less amount and is thereby more electrically conductive than $Al_2O_3$ having the stoichiometric composition. This contributes to reduction of the contact resistivity even without barrier metal layers. Specifically, when a conventional aluminum interconnection material is brought into direct contact with the transparent picture electrode without the interposition of barrier metal layer, a thick film containing oxygen in a substantially same amount as $Al_2O_3$ and having a high resistivity is formed at the interface, and this causes an increased contact resistivity. However, the configuration according to the present invention can avoid this problem.

The thickness of the oxide AlOx is preferably about 1 to 10 nm, more preferably about 2 to 8 nm, and further preferably around 5 nm.

The electrically conductive oxide film (AlOx) is preferably deposited using a film-deposition process comprising two or more steps. For example, initially, an ITO film for constituting the transparent picture electrode is deposited to a thickness of about 5 to 20 nm, preferably around 10 nm, by sputtering at a substrate temperature of preferably about 100° C. to 200° C. using a non-oxidative gas such as argon gas. During this procedure, namely, in early stages of the deposition of the ITO film constituting the transparent picture electrode, the film deposition is preferably carried out in an atmosphere free from oxygen so as to avoid oxidation of the surface of the Al—Ni alloy thin film. When the film deposition is conducted in an atmosphere free from oxygen in this manner, the resulting ITO film deposited by sputtering contains a less amount of oxygen to thereby decrease the electrical conductivity of the ITO film itself. However, the reduction in electrical conductivity can be compensated by appropriately heating the substrate during this process, because the crystallinity of ITO increases as a result of such heating.

Next, the atmospheric gas is changed from the non-oxidative gas to an oxygen-containing gas comprising a non-oxidative gas and oxygen gas, and a film is deposited, for example, to a thickness of about 20 to 200 nm, preferably around 40 nm while maintaining the temperature of the substrate. The oxygen content of the atmospheric gas herein is not specifically limited but is preferably so set that the oxygen partial pressure is 10 to 50 µTorr, preferably around 20 µTorr with respect to the argon pressure, for example, of about 1 to 5 mTorr, preferably around 3 mTorr. The present inventors have experimentally revealed that the electrical resistivity of the deposited ITO film is minimized to about $1 \times 10^{-4}$ $\Omega \cdot cm^2$ under these conditions. The same advantages can be obtained by adding water vapor instead of oxygen to the atmospheric gas. Thus, the ITO film itself can have a sufficiently high electrical conductivity while preventing the oxidation of the aluminum alloy film in early stages of the deposition of ITO film, by carrying out the deposition of ITO film by sputtering in two or more steps while changing the oxygen content of the atmospheric gas.

Next, the nickel-enriched layer formed at the interface between the Al—Ni alloy thin film and the transparent picture electrode will be illustrated. The nickel-enriched layer is electrically conductive and contributes to the reduction in contact resistivity, as in the AlOx film.

The average nickel concentration of the nickel-enriched layer is preferably 2 folds or more and more preferably 2.5 folds or more the average nickel concentration of the Al—Ni alloy. The thickness of the nickel-enriched layer is preferably 0.5 nm or more and 10 nm or less, and more preferably 1.0 nm or more and 5 nm or less.

The sample TFTs prepared by using the specific Al—Ni alloy thin films were found to realize thin-film transistor properties, contact resistivity, and thermal stability equal to or higher than those of conventional TFTs using conventional aluminum alloy thin films with the interposition of barrier metal layers such as chromium layer, as demonstrated in after-mentioned Experimental Examples. Accordingly, the source/drain electrodes according to Second Embodiment of the present invention eliminate the need of barrier metal layers, thereby simplify the manufacturing processes, and reduce the production cost. In addition, they enable sufficiently reduced electrical resistivity at relatively low heating process temperature of about 200° C. and permit to select the types of display device materials and process conditions within wider ranges.

Embodiment 1

Certain preferred embodiments of the thin-film transistor substrates according to the present invention will be illustrated below, with reference to the attached drawings. Such preferred embodiments will be illustrated by taking a liquid crystal display device comprising an amorphous silicon thin-film transistor substrate as a representative example. It is to be noted that the followings are only examples which by no means limit the scope of the present invention, and various changes and modifications are possible therein without departing from the teaching and scope of the present invention. The present inventors have experimentally verified that the source/drain electrodes according to the present invention can also be applied to, for example, reflective electrodes typically for reflective liquid crystal display devices, and TAB connecting electrodes for input and output of signals from or to the outside.

An embodiment of the amorphous silicon thin-film transistor substrate according to the present invention will be illustrated in detail with reference to FIG. 3.

Figure 2:
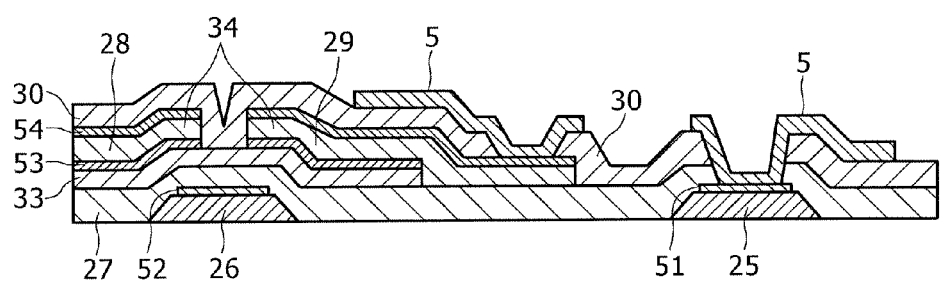
FIG. 2 is a schematic sectional view illustrating the configuration of a representative conventional amorphous silicon thin-film transistor substrate.
Figure 3:
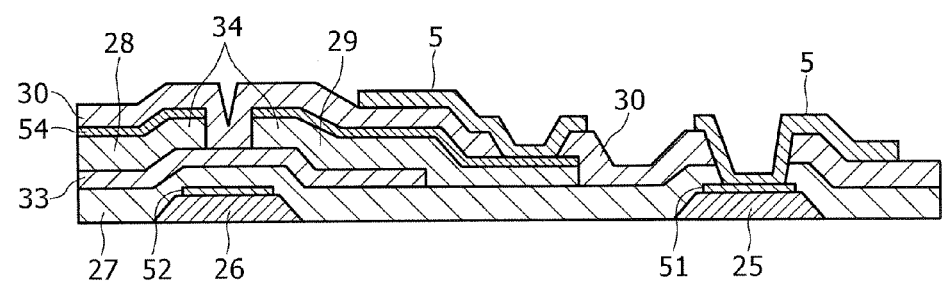
FIG. 3 is a schematic sectional view illustrating the configuration of a thin-film transistor substrate as an embodiment of the present invention.

FIG. 3 is a schematic cross-sectional view illustrating a preferred embodiment of the thin-film transistor substrate according to the present invention. In FIG. 3, components corresponding to those in the conventional thin-film transistor substrate in FIG. 2 have the same reference numerals.

With reference to FIG. 3, a source electrode 28 and a drain electrode 29 are electrically connected to a source/drain interconnection 34. The source/drain interconnection 34 comprises a nitrogen-containing layer (not shown) and an Al-2.0 atomic percent Ni alloy film (not shown), and the nitrogen-containing layer is so arranged as to cover a channel amorphous silicon thin film 33. The configuration of the source/drain interconnection 34 will be illustrated in detail in after-mentioned FIGS. 4E and 4F.

A comparison between FIG. 2 and FIG. 3 shows that the conventional thin-film transistor substrate comprises the lower barrier metal layer 53 and the upper barrier metal layer 54 made typically of molybdenum (Me) on and below the source/drain electrodes (FIG. 2); whereas the thin-film transistor substrate according to the present invention does not include the lower barrier metal layer 53 (FIG. 3). In addition, as demonstrated in after-mentioned Experimental Examples, the present invention also eliminates the need of arranging the upper barrier metal layer 54.

This embodiment enables direct connection between the aluminum alloy and the channel amorphous silicon thin film through the nitrogen-containing layer without the interposition of the lower barrier metal layer, in contrast to conventional equivalents. This realizes good thin-film transistor properties equivalent to or higher than those of the conventional thin-film transistor substrate (see after-mentioned Experimental Examples 1 and 2). Additionally, another embodiment of the present invention enables direct connection between the aluminum alloy and the transparent picture electrode without the interposition of the upper barrier metal layer, in contrast to conventional equivalents. This also ensures good thin-film transistor properties equivalent to or higher than those of the conventional thin-film transistor substrate (see after-mentioned Experimental Examples).

Consequently, the present invention eliminates the need of upper and lower barrier metal layers essential for conventional interconnections.

Next, a method for manufacturing the thin-film transistor substrate shown in FIG. 3 according to the present invention will be illustrated with reference to FIGS. 4A to 4G. The components in FIG. 4 corresponding to those in FIG. 3 have the same reference numerals.

Figure 4A:
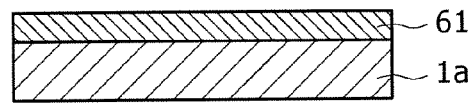
FIGS. 4A, 4B, 4C, 4D, 4E, 4F, and 4G are process drawings showing part of the manufacturing processes of the thin-film transistor substrate shown in FIG. 3.
Figure 4B:
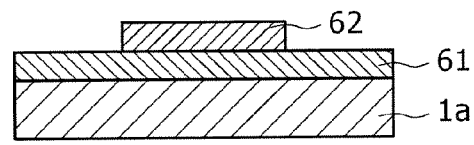
Figure 4C:
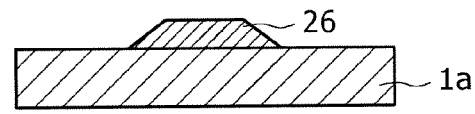

Initially, an aluminum alloy thin film (Al-2.0 atomic percent Nd) 61 having a thickness of about 200 nm, and a molybdenum thin film 52 (not shown) having a thickness of about 50 nm were sequentially deposited on a glass substrate 1a typically by sputtering (FIG. 4A). The film-deposition by sputtering was carried out at room temperature. A pattern of a resist 62 was produced on the multilayer thin film by photolithography (FIG. 4B), and the multilayer film comprising the aluminum alloy thin film 61 and the molybdenum thin film 52 was etched using the patterned resist 62 as a mask to thereby form a gate electrode 26 (FIG. 4C). In this procedure, the periphery of the multilayer thin film is preferably etched in a taper-shape at an angle of about 30° to about 60° so as to improve the coverage of a gate insulator 27 to be deposited thereon.

Figure 4D:
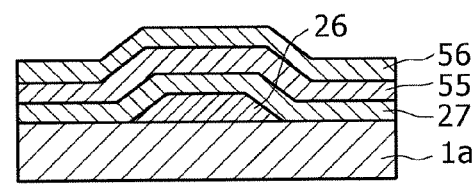

Next, a silicon nitride film (gate insulator) 27 having a thickness of about 300 nm was deposited typically by plasma CVD (FIG. 4D). The film-deposition by plasma CVD herein was conducted at a temperature of about 350° C. On the silicon nitride film (gate insulator) 27 were sequentially deposited an undoped hydrogenated amorphous silicon film (a-Si—H) 55 having a thickness of about 200 nm and a phosphorus-doped n-type hydrogenated amorphous silicon film (n$^+$ a-Si—H) 56 having a thickness of about 80 nm typically by plasma CVD. The n$^+$-type hydrogenated amorphous silicon film was deposited by carrying out plasma CVD using $SiH_4$ and $PH_3$ as materials.

Figure 4E:
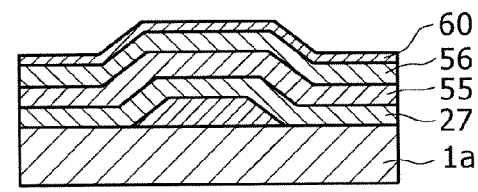

Subsequently, a nitrogen-containing layer 60 was formed on the n$^+$-type hydrogenated amorphous silicon film (n$^+$ a-Si—H) 56 in the chamber of the plasma CVD system used in the deposition of the silicon nitride film (FIG. 4E). Specifically, the material gas used for the deposition of the amorphous silicon film was evacuated from the chamber while the substrate was kept in the chamber. Next, the surface of the n$^+$-type hydrogenated amorphous silicon film 56 was treated with plasma for three minutes, which plasma was generated while feeding nitrogen gas alone as a carrier gas to the chamber. Thus, a nitrogen-containing layer 60 was formed. This plasma treatment was carried out at a radio-frequency power density of 0.24 W/cm$^2$, a film-deposition temperature of 320° C., and a gas pressure of 67 Pa. The surface of the work was analyzed by RBS and XPS to find that the nitrogen-containing layer was formed to a thickness of about 5.8 nm.

The nitrogen-containing layer 60 was formed in this embodiment by a plasma nitridation process. However, the formation process of this layer is not limited thereto, and a desired nitrogen-containing layer can also be formed by the above-mentioned thermal nitridation process (ii) and the amination process (iii), as demonstrated by the experiments (after-mentioned Experimental Examples 1 to 4).

Figure 4F:
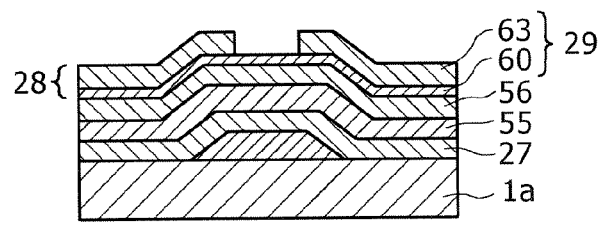
Figure 4G:
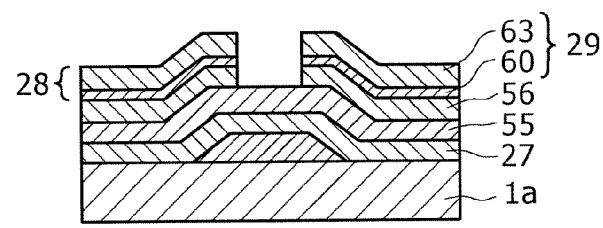

Next, an Al-2.0 atomic percent Ni alloy film 63 having a thickness of about 300 nm was deposited on the nitrogen-containing layer 60 typically by sputtering (FIG. 4F). The film-deposition by sputtering was carried out at room temperature. A pattern of a resist was then produced by photolithography; and the Al-2.0 atomic percent Ni alloy film 63 was etched using the patterned resist as a mask, to thereby form a source electrode 28 and a drain electrode 29 (FIG. 4F). The n$^+$-type hydrogenated amorphous silicon film 56 was stripped by dry etching using the source electrode 28 and the drain electrode 29 as a mask (FIG. 4G).

A silicon nitride film (protecting film) (not shown) was deposited to a thickness of about 300 nm typically in a plasma nitridation system. The film deposition herein was conducted at a temperature of about 200° C. Next, a contact hole 57 was formed by producing a pattern of a resist on the silicon nitride film 30 and carrying out, for example, dry etching.

Next, an ashing step typically using oxygen plasma was conducted, and the photoresist layer (not shown) was stripped using a remover containing, for example, an amine. An ITO film (indium oxide further containing 10 percent by mass of tin oxide) was deposited to a thickness of about 50 nm. Next, patterning by wet etching was carried out to thereby yield a transparent picture electrode 5. Thus, the thin-film transistor substrate was completed.

In the thin-film transistor substrate according to this embodiment, the Al—Ni alloy thin film is directly connected to the channel amorphous silicon thin film through the nitrogen-containing layer and is further directly connected to the ITO film.

The transparent picture electrode 5 herein is an ITO film, but it can also be an IZO film. Instead of an amorphous silicon, a polysilicon (polycrystalline silicon) can be used as the active semiconductor layer.

The liquid crystal display device shown in FIG. 1 is prepared by using the above-prepared thin-film transistor substrate, for example, by the following method.

Initially, an alignment layer is formed by applying a film of, for example, a polyimide to the thin-film transistor substrate 1, drying the film, and carrying out rubbing.

Regarding a counter substrate 2, a light shielding film 9 is formed on a glass substrate by patterning, for example, chromium as a matrix. Next, red, green, and blue resinous color filters 8 are formed in interstices in the matrix-shaped light shielding film 9. A transparent conductive film, such as an ITO film, as a common electrode 7 is formed on the light shielding film 9 and the color filter 8. Thus, the counter electrode is provided. An alignment layer 11 is then formed by applying a film of, for example, a polyimide to the uppermost layer of the counterelectrode, drying, and rubbing the resulting film.

Next, the thin-film transistor substrate 1 and the counter substrate 2 are placed so that the TFT of the thin-film transistor substrate 1 and the alignment layer 11 of the counter substrate 2 face each other. These two substrates are bonded, except for a filling port for a liquid crystal, using a sealing material 16 such as a resin. In this procedure, the distance (gap) between the thin-film transistor substrate 1 and the counter substrate 2 is kept substantially constant by, for example, interposing a spacer 15 between them.

The thus-prepared empty cell is filled with a liquid crystal material to form a liquid crystal layer by placing the cell in a vacuum, and gradually increasing the pressure to an atmospheric pressure while immersing the filling port in the liquid crystal material. The filling port is then sealed. Finally, polarizers 10 are attached to the both sides of the cell to complete a liquid crystal panel.

Next, a driver circuit 13 is electrically connected to the liquid crystal panel and is arranged on a lateral side or backside of the liquid crystal panel so as to drive the liquid crystal display device. A frame 23 having an opening to be a screen of the liquid crystal panel, a backlight 22 as a flat light source, and another frame 23 are arranged so as to hold the liquid crystal panel to thereby complete the liquid crystal display device.

EXPERIMENTAL EXAMPLES

Experiments were conducted in following Experimental Examples 1 to 5 to verify that excellent thin-film transistor properties can be obtained even without barrier metal layers by using source/drain electrodes containing a nitrogen-containing layer as in the present invention. The experimental conditions and determination methods of the properties are as follows.

Source/Drain Electrodes

The source/drain electrodes according to Embodiment 1 using Al-2.0 atomic percent Ni alloy were used in Experimental Examples 1 to 4. The source/drain electrodes according to Embodiment 1 were used in Experimental Example 5, except for using pure aluminum instead of the Al-2.0 atomic percent Ni alloy. Experimental Examples 1 to 4 differ from one another only by the formation method of the nitrogen-containing layer for the source/drain electrodes. Specifically, the nitrogen-containing layer was formed by the plasma nitridation process in Experimental Example 1, which process is described in detail in Embodiment 1; by the thermal nitridation process in Experimental Example 2; and by the amidation process in Experimental Examples 3 and 4, respectively.

Experimental Example 1

A thin-film transistor was prepared by the procedure of Embodiment 1.

Experimental Example 2

A thin-film transistor was prepared by the procedure of Embodiment 1, except for forming a nitrogen-containing layer in the following manner.

Initially, an $n^+$-type hydrogenated amorphous silicon film ($n^+$ a-Si—H) 56 was formed by the procedure of Embodiment 1. Next, heating was conducted using nitrogen gas as a carrier gas at 350° C. for thirty minutes in the plasma nitridation system used for the deposition of the silicon nitride film. The surface of the work after heating was analyzed by the procedure of Embodiment 1 to find that a nitrogen-containing layer was formed to a thickness of about 6 nm.

Experimental Example 3

A thin-film transistor was prepared by the procedure of Embodiment 1, except for forming a nitrogen-containing layer in the following manner.

Initially, an $n^+$-type hydrogenated amorphous silicon film ($n^+$ a-Si—H) 56 was formed by the procedure of Embodiment 1. Next, this was placed in an ultraviolet irradiator, and ultraviolet radiation at a wavelength of 254 nm was applied for sixty minutes while feeding nitrogen gas to the irradiator. The surface of the work after heating was analyzed by the procedure of Embodiment 1 to find that a nitrogen-containing layer was formed to a thickness of about 3 nm.

Experimental Example 4

A thin-film transistor was prepared by the procedure of Embodiment 1, except for forming a nitrogen-containing layer in the following manner.

Initially, an $n^+$-type hydrogenated amorphous silicon film ($n^+$ a-Si—H) 56 was formed by the procedure of Embodiment 1. Next, this was immersed in a 1 percent by volume aqueous ammonia solution, and ultraviolet radiation at a wavelength of 254 nm was applied to the surface of the work for sixty minutes. The surface of the work after heating was analyzed by the procedure of Embodiment 1 to find that a nitrogen-containing layer was formed to a thickness of about 2 nm.

Experimental Example 5

A thin-film transistor was prepared by the procedure of Embodiment 1, except for using pure aluminum instead of the Al-2.0 atomic percent Ni alloy. The nitrogen-containing layer herein had a thickness of about 5.8 nm.

TFT Test Piece

The above-prepared TFTs having the configuration shown in FIG. 4G of Embodiment 1 were subjected to annealing at 300° C. for thirty minutes. These were used as test pieces for the sake of easy and convenient determination of the thin-film transistor properties. The annealing condition herein was set simulating such a heating treatment in a film-deposition step of a silicon nitride film (protecting film) as to yield a maximum thermal hysteresis. The TFT test pieces used in these Experimental Examples have not been completed through various film-deposition steps as in actual thin-film transistor substrates, but the TFT test pieces after annealing are considered to have properties substantially reflecting the properties of actual thin-film transistor substrates.

Evaluation on Interdiffusion Between Silicon and Aluminum

On the TFT test pieces, the interface between the channel amorphous silicon thin film and the Al—Ni alloy or pure aluminum was observed to detect whether or not interdiffusion between silicon and aluminum occurred. Specifically, the interface was observed under a cross-sectional transmission electron microscope (cross-sectional TEM) at a magnification of 60×10$^4$ times, and the interdiffusion between silicon and aluminum at the interface was quantitatively analyzed by energy dispersive X-ray fluorescence spectroscopy (EDX).

Determination of Thin-Film Transistor Properties

The switching behaviors on drain current-gate voltage of the TFT test pieces were determined. The interdiffusion between silicon and aluminum can also be indirectly evaluated by this property. In this procedure, the leak current flowing when the thin-film transistor is turned off (the drain current when a negative voltage is applied to the gate voltage; OFF-state current), and the ON-state current flowing when the thin-film transistor is turned on were determined in the following manner.

Using TFT test pieces having a gate length (L) of 10 μm, a gate width (W) of 100 μm, and a ratio of the gate width to the gate length (W/L) of 10, the drain current and the gate voltage were measured. In the measurement, the drain voltage was set at 10V. The OFF-state current herein was defined as the current when a gate voltage at −3 V was applied, and the ON-state current was defined as the voltage when the gate voltage reached 20 V.

The measured thin-film transistor properties were evaluated with the thin-film transistor properties of Comparative Sample 1 as reference values in the following manner. As Comparative Sample 1, a thin-film transistor was prepared using source/drain electrodes comprising a pure aluminum thin film and chromium barrier metal layers, and the properties of the TFT were measured. The TFT according to Comparative Sample 1 had an ON-state current of 1.2×10$^{-5}$ A and an OFF-state current of 4.0×10$^{-13}$ A. These values were defined as the reference values. A test piece having an OFF-state current ten folds or less the reference value (4.0×10$^{-12}$ A or less) was evaluated as "Good", and one having an OFF-state current higher than this range was evaluated as "NG" (No Good). On the ON-state current, a test piece having an ON-state current 20% or less lower than the reference value (9.6×10$^{-6}$ A or less) was evaluated as "Good", and one having an ON-state current out of this range was evaluated as "NG".

Results

Figure 5:
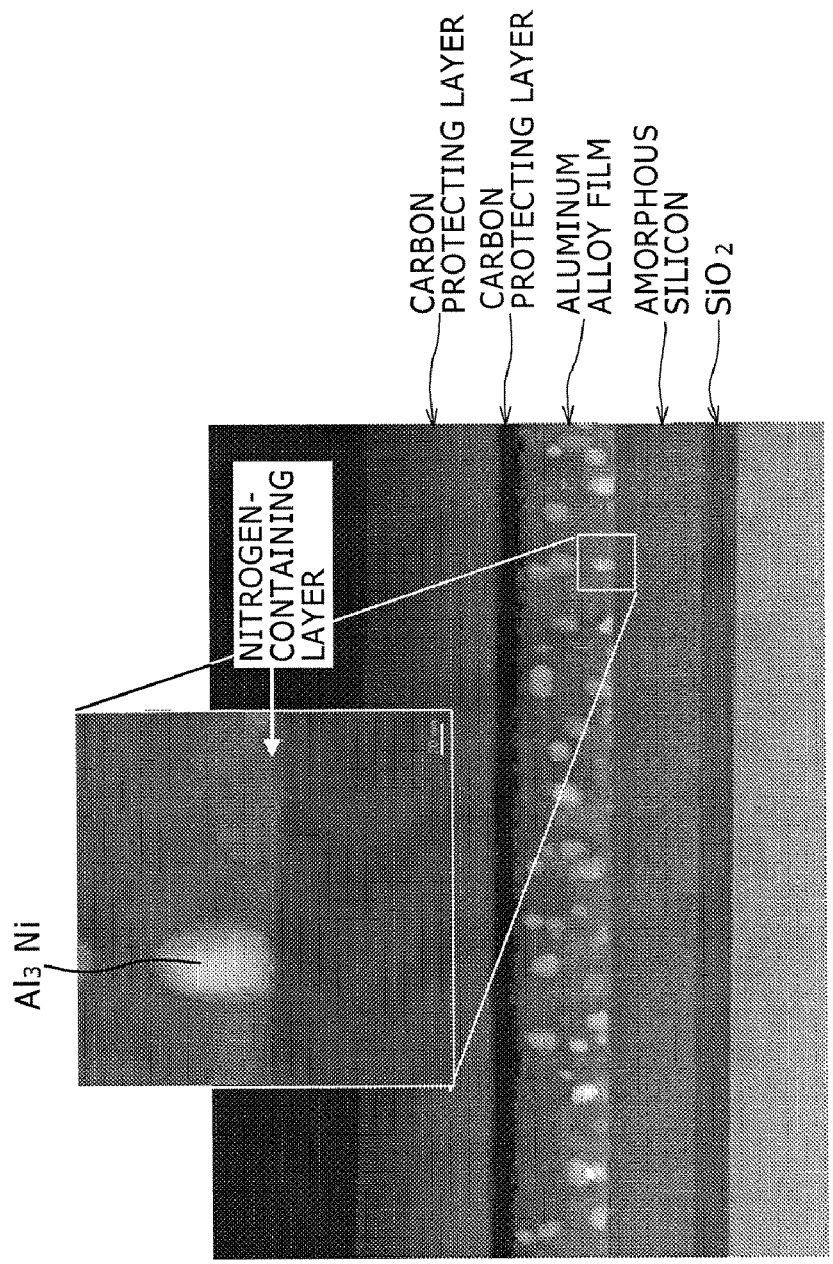
FIG. 5 is a cross-sectional transmission electron micrograph of the interface between a channel amorphous silicon thin film and an Al—Ni alloy thin film prepared in Experimental Example 1.

FIG. 5 is a cross-sectional transmission electron micrograph of the test piece according to Experimental Example 1. FIG. 5 demonstrates that a nitrogen-containing layer (nitride layer) is formed in the vicinity of the interface between the channel amorphous silicon thin film and the Al—Ni alloy thin film for source/drain electrodes. Bright portions indicated by the arrow in FIG. 5 are precipitated Al$_3$Ni grains.

The interface was analyzed by EDX to find that the interface is smooth without interdiffusion between silicon and aluminum.

The same results were also observed in the test pieces according to Experimental Examples 2 to 5, while micrographs of these test pieces are omitted.

The thin-film transistor properties of the test pieces according to Comparative Sample 1 and Experimental Examples 1 to 5 are shown in Table 1.

TABLE 1

| No. | Source/drain Electrode | OFF-state current [A] | ON-state current [A] | Evaluation |
|---|---|---|---|---|
| Comparative Sample 1 | Cr + pure Al | 4.0 × 10$^{-13}$ | 1.2 × 10$^{-5}$ | Good |
| Experimental Example 1 | Al-2.0 atomic % Ni | 3.4 × 10$^{-13}$ | 1.1 × 10$^{-5}$ | Good |
| Experimental Example 2 | Al-2.0 atomic % Ni | 4.3 × 10$^{-13}$ | 1.2 × 10$^{-5}$ | Good |
| Experimental Example 3 | Al-2.0 atomic % Ni | 8.2 × 10$^{-13}$ | 1.2 × 10$^{-5}$ | Good |
| Experimental Example 4 | Al-2.0 atomic % Ni | 5.4 × 10$^{-13}$ | 1.1 × 10$^{-5}$ | Good |
| Experimental Example 5 | pure Al | 1.5 × 10$^{-13}$ | 1.3 × 10$^{-5}$ | Good |

Table 1 shows that the TFTs according to Experimental Examples 1 to 5 have good thin-film transistor properties substantially equivalent to those of Comparative Sample 1 (conventional equivalent), regardless of the process of forming the nitrogen-containing layer.

These results show that, by using the source/drain electrodes according to Embodiment 1, the interdiffusion between silicon and aluminum at the interface between the channel amorphous silicon thin film and the aluminum alloy film can be effectively prevented even without lower barrier metal layer, and good thin-film transistor properties are realized.

Comparative Sample 2

In this connection, an attempt was made to form an AlN layer as a lower layer of a pure aluminum thin film by the method in JP-A No. 2003-273109, but the aluminum thin film was delaminated. Thus, the thin-film transistor properties of this test piece were not determined. The delamination of the aluminum thin film occurred probably because the AlN layer was formed only as a lower layer of the aluminum thin film, and this causes an intensive stress on the aluminum alloy.

Experimental Example 6

A series of TFT test pieces was prepared by the procedure of Experimental Example 1, except for varying the condition (plasma irradiation time) of the plasma nitridation process as in Table 2, and the properties of the TFT test pieces were evaluated by the procedure of Experimental Example 1. The data in Table 2 on the thickness of the nitrogen-containing layer, the N/Si ratio (number of nitrogen atoms/number of silicon atoms), and the surface density of nitrogen were determined by the above-mentioned methods.

Comparative Sample 3

A TFT test piece as a comparative sample was prepared by the procedure of Experimental Example 1, except that the nitrogen-containing layer was not formed. Next, on the TFT test piece, the interface between the channel amorphous silicon thin film and the Al—Ni alloy thin film was observed, and the thin-film transistor properties were evaluated by the procedure of Experimental Example 1.

Figure 6:
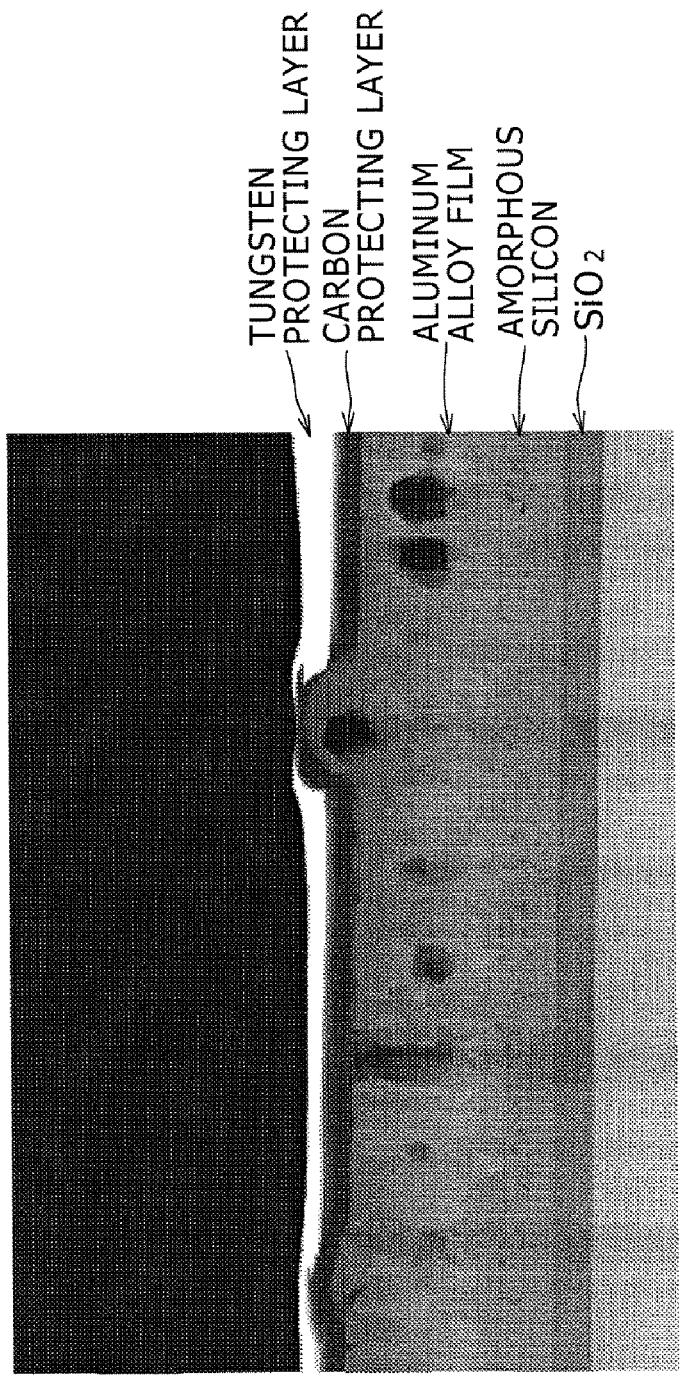
FIG. 6 is a cross-sectional transmission electron micrograph of the interface between a channel amorphous silicon thin film and an Al—Ni alloy thin film of a sample having no nitrogen-containing layer as a comparative sample.

FIG. 6 is a cross-sectional transition electron micrograph of the test piece according to Comparative Sample 3. FIG. 6 demonstrates that a lot of voids (indicated by the arrow in FIG. 6) are observed in the channel amorphous silicon thin film and the Al—Ni alloy thin film for source/drain electrodes. This indicates that interdiffusion between aluminum and silicon frequently occurred at the interface. The interface was analyzed by EDX, and significant interdiffusion between silicon and aluminum was observed.

The properties of the TFT test pieces according to Experimental Example 6 (Sample Nos. 3 to 9) and Comparative Sample 3 (Sample No. 2) are shown in Table 2. Table 2 also shows the results of Comparative Sample 1 in Table 1 (Sample No. 1).

TABLE 2

| No. | Source/drain electrode | Plasma nitridation | Thickness of nitrogen-containing layer [nm] | N/Si ratio | Surface density of nitrogen [cm$^{-2}$] | OFF-state current [A] | ON-state current [A] | Evaluation |
|---|---|---|---|---|---|---|---|---|
| 1 | Cr + pure Al | none | — | — | — | $4.0 \times 10^{-13}$ | $1.2 \times 10^{-5}$ | Good |
| 2 | Al-2.0 atomic % Ni | none | — | — | — | $2.1 \times 10^{-9}$ | $6.4 \times 10^{-7}$ | NG |
| 3 | Al-2.0 atomic % Ni | 0.5 min. | <1 | 0.15 | $9.2 \times 10^{13}$ | $7.0 \times 10^{-10}$ | $8.2 \times 10^{-7}$ | NG |
| 4 | Al-2.0 atomic % Ni | 1 min. | 4.5 | 0.62 | $5.8 \times 10^{15}$ | $4.0 \times 10^{-13}$ | $1.2 \times 10^{-5}$ | Good |
| 5 | Al-2.0 atomic % Ni | 3 min. | 5.8 | 1 | $6.8 \times 10^{15}$ | $3.4 \times 10^{-13}$ | $1.1 \times 10^{-5}$ | Good |
| 6 | Al-2.0 atomic % Ni | 5 min. | 6.3 | 1.1 | $7.0 \times 10^{15}$ | $3.1 \times 10^{-13}$ | $1.1 \times 10^{-5}$ | Good |
| 7 | Al-2.0 atomic % Ni | 10 min. | 7.2 | 1.3 | $7.3 \times 10^{15}$ | $2.8 \times 10^{-13}$ | $9.8 \times 10^{-6}$ | Good |
| 8 | Al-2.0 atomic % Ni | 30 min. | 21 | 1.3 | $2.1 \times 10^{16}$ | $2.5 \times 10^{-13}$ | $1.4 \times 10^{-6}$ | NG |
| 9 | pure Al | 3 min. | 5.8 | 1 | $6.8 \times 10^{15}$ | $1.5 \times 10^{-12}$ | $1.3 \times 10^{-5}$ | Good |

In Table 2, Samples Nos. 4 to 7 and 9 are inventive samples satisfying the preferred conditions in the present invention, Sample No. 2 is a Comparative Sample having no nitrogen-containing layer, and Samples Nos. 3 and 8 are referential samples which do not satisfy the preferred conditions in the present invention. Of the inventive samples, Samples Nos. 4 to 7 each comprise an Al—Ni alloy layer, and Sample No. 9 comprises a pure aluminum layer.

Table 2 shows that Samples No. 4 to 7 have thin-film transistor properties as good as Sample No. 1 (conventional equivalent). They are prepared by setting the plasma irradiation time at about 1 minute to 10 minutes and suitably controlling the thickness of the nitrogen-containing layer, the N/Si ratio (the ratio of the number of nitrogen atoms to the number of silicon atoms), and the surface density of nitrogen.

In contrast, Samples Nos. 2, 3 and 8 show deteriorated thin-film transistor properties. Although the details of reasons are not clarified, the referential sample No. 8 shows poor thin-film transistor properties probably mainly because a longer plasma irradiation time causes a thicker nitrogen-containing layer and thereby causes damages on the channel amorphous silicon thin film, and a trace amount of contaminated oxygen in the plasma causes oxidation of silicon on the surface of the channel amorphous silicon thin film.

Experimental Example 7

Thin-film transistor samples were prepared and the thin-film transistor properties thereof were determined by the procedure of Experimental Example 1, except for varying the nickel content of the Al—Ni alloy as in Table 3. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 3.

TABLE 3

| Source/drain electrode | OFF-state current [A] | ON-state current [A] | Evaluation |
|---|---|---|---|
| Al-0.1 atomic % Ni | $4.1 \times 10^{-13}$ | $1.2 \times 10^{-5}$ | Good |
| Al-0.3 atomic % Ni | $3.2 \times 10^{-13}$ | $1.1 \times 10^{-5}$ | Good |

TABLE 3-continued

| Source/drain electrode | OFF-state current [A] | ON-state current [A] | Evaluation |
|---|---|---|---|
| Al-0.5 atomic % Ni | $3.9 \times 10^{-13}$ | $1.1 \times 10^{-5}$ | Good |
| Al-4.0 atomic % Ni | $5.1 \times 10^{-13}$ | $1.1 \times 10^{-5}$ | Good |
| Al-6.0 atomic % Ni | $5.3 \times 10^{-13}$ | $1.2 \times 10^{-5}$ | Good |

Table 3 shows that the TFT samples using Al—Ni alloy thin films having a varying nickel content within the range from 0.1 atomic percent to 6 atomic percent have good thin-film transistor properties.

Experimental Example 8

Thin-film transistor samples were prepared and the thin-film transistor properties thereof were determined by the procedure of Experimental Example 1, except for further incorporating La or Nd as a third component to an Al-2.0 atomic percent Ni alloy or Al-0.1 atomic percent Ni alloy and varying the content of La or Nd as in Table 4. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 4.

TABLE 4

| Source/drain electrode | OFF-state current [A] | ON-state current [A] | Evaluation |
|---|---|---|---|
| Al-2.0 atomic % Ni-0.1 atomic % La | $3.3 \times 10^{-13}$ | $1.2 \times 10^{-5}$ | Good |
| Al-2.0 atomic % Ni-0.3 atomic % La | $5.3 \times 10^{-13}$ | $1.1 \times 10^{-5}$ | Good |
| Al-2.0 atomic % Ni-2.0 atomic % La | $7.4 \times 10^{-13}$ | $1.1 \times 10^{-5}$ | Good |
| Al-2.0 atomic % Ni-0.1 atomic % Nd | $4.0 \times 10^{-13}$ | $1.2 \times 10^{-5}$ | Good |
| Al-2.0 atomic % Ni-0.3 atomic % Nd | $6.7 \times 10^{-13}$ | $1.2 \times 10^{-5}$ | Good |
| Al-2.0 atomic % Ni-1.0 atomic % Nd | $5.8 \times 10^{-13}$ | $1.2 \times 10^{-5}$ | Good |
| Al-0.1 atomic % Ni-0.1 atomic % La | $2.9 \times 10^{-13}$ | $1.2 \times 10^{-5}$ | Good |
| Al-0.1 atomic % Ni-0.3 atomic % La | $4.3 \times 10^{-13}$ | $1.2 \times 10^{-5}$ | Good |
| Al-0.1 atomic % Ni-2.0 atomic % La | $5.4 \times 10^{-13}$ | $1.2 \times 10^{-5}$ | Good |

TABLE 4-continued

| Source/drain electrode | OFF-state current [A] | ON-state current [A] | Evaluation |
|---|---|---|---|
| Al-0.1 atomic % Ni-0.1 atomic % Nd | $3.0 \times 10^{-13}$ | $1.2 \times 10^{-5}$ | Good |
| Al-0.1 atomic % Ni-0.3 atomic % Nd | $5.1 \times 10^{-13}$ | $1.1 \times 10^{-5}$ | Good |
| Al-0.1 atomic % Ni-1.0 atomic % Nd | $7.6 \times 10^{-13}$ | $1.1 \times 10^{-5}$ | Good |

Table 4 shows that the TFT samples using Al—Ni—La alloys containing 0.1 atomic percent to 2.0 atomic percent of La and those using Al—Ni—Nd alloys containing 0.1 atomic percent to 2.0 atomic percent of Nd have good thin-film transistor properties.

Experimental Example 9

Thin-film transistor samples were prepared and the thin-film transistor properties thereof were determined by the procedure of Experimental Example 1, except for further incorporating 0.3 atomic percent of any of the elements shown in Table 5 (the elements belonging to Group X1) as a third component to an Al-2.0 atomic percent Ni alloy. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 5.

TABLE 5

| Source/drain electrode | OFF-state current [A] | ON-state current [A] | Evaluation |
|---|---|---|---|
| Al-2.0 atomic % Ni-0.3 atomic % Ti | $3.1 \times 10^{-13}$ | $1.2 \times 10^{-5}$ | Good |
| Al-2.0 atomic % Ni-0.3 atomic % V | $5.5 \times 10^{-13}$ | $1.1 \times 10^{-5}$ | Good |
| Al-2.0 atomic % Ni-0.3 atomic % Zr | $7.9 \times 10^{-13}$ | $1.1 \times 10^{-5}$ | Good |
| Al-2.0 atomic % Ni-0.3 atomic % Nb | $6.0 \times 10^{-13}$ | $1.2 \times 10^{-5}$ | Good |
| Al-2.0 atomic % Ni-0.3 atomic % Mo | $3.7 \times 10^{-13}$ | $1.2 \times 10^{-5}$ | Good |
| Al-2.0 atomic % Ni-0.3 atomic % Hf | $9.8 \times 10^{-13}$ | $1.2 \times 10^{-5}$ | Good |
| Al-2.0 atomic % Ni-0.3 atomic % Ta | $3.7 \times 10^{-13}$ | $1.2 \times 10^{-5}$ | Good |
| Al-2.0 atomic % Ni-0.3 atomic % W | $5.6 \times 10^{-13}$ | $1.1 \times 10^{-5}$ | Good |

Table 5 shows that the TFT samples using Al—Ni—X1 alloys comprising the elements belonging to Group X1 have good thin-film transistor properties.

Experimental Example 10

Thin-film transistor samples were prepared and the thin-film transistor properties thereof were determined by the procedure of Experimental Example 1, except for further incorporating 1.0 atomic percent of any of the elements shown in Table 6 (the elements belonging to Group X2) as a third component to an Al-2.0 atomic percent Ni alloy. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 6.

TABLE 6

| Source/drain electrode | OFF-state current [A] | ON-state current [A] | Evaluation |
|---|---|---|---|
| Al-2.0 atomic % Ni-1.0 atomic % Mg | $1.5 \times 10^{-12}$ | $1.3 \times 10^{-5}$ | Good |
| Al-2.0 atomic % Ni-1.0 atomic % Cr | $9.1 \times 10^{-13}$ | $1.2 \times 10^{-5}$ | Good |
| Al-2.0 atomic % Ni-1.0 atomic % Mn | $7.2 \times 10^{-13}$ | $1.1 \times 10^{-5}$ | Good |
| Al-2.0 atomic % Ni-1.0 atomic % Ru | $5.9 \times 10^{-13}$ | $1.1 \times 10^{-5}$ | Good |
| Al-2.0 atomic % Ni-1.0 atomic % Rh | $6.5 \times 10^{-13}$ | $1.3 \times 10^{-5}$ | Good |
| Al-2.0 atomic % Ni-1.0 atomic % Pd | $4.5 \times 10^{-13}$ | $1.3 \times 10^{-5}$ | Good |
| Al-2.0 atomic % Ni-1.0 atomic % Ir | $4.1 \times 10^{-13}$ | $1.2 \times 10^{-5}$ | Good |
| Al-2.0 atomic % Ni-1.0 atomic % Pt | $5.2 \times 10^{-13}$ | $1.1 \times 10^{-5}$ | Good |
| Al-2.0 atomic % Ni-1.0 atomic % Gd | $8.9 \times 10^{-13}$ | $1.1 \times 10^{-5}$ | Good |
| Al-2.0 atomic % Ni-1.0 atomic % Tb | $1.5 \times 10^{-12}$ | $1.3 \times 10^{-5}$ | Good |
| Al-2.0 atomic % Ni-1.0 atomic % Dy | $5.2 \times 10^{-13}$ | $1.1 \times 10^{-5}$ | Good |
| Al-2.0 atomic % Ni-1.0 atomic % Y | $4.9 \times 10^{-13}$ | $1.1 \times 10^{-5}$ | Good |
| Al-2.0 atomic % Ni-1.0 atomic % Co | $8.1 \times 10^{-13}$ | $1.1 \times 10^{-5}$ | Good |
| Al-2.0 atomic % Ni-1.0 atomic % Fe | $7.3 \times 10^{-13}$ | $1.2 \times 10^{-5}$ | Good |

Table 6 demonstrates that the TFT samples prepared by using Al—Ni—X2 alloys containing the elements belonging to Group X2 have good thin-film transistor properties.

Following Experimental Examples 11 to 13 were conducted while varying the conditions for the formation of the nitrogen-containing layer (gas pressure, film-deposition temperature, and gas composition) as follows, so as to determine how the thin-film transistor properties vary depending on the ratio of surface density of nitrogen (N1) to the surface density of oxygen (O1) of the nitrogen-containing layer (N1/O1).

Experimental Example 11

How the ratio N1/O1 varies depending on the pressure varying in the range of 33 to 399 Pa was determined.

Specifically, TFT samples were prepared by a modified method corresponding to the method described in Embodiment 1 above. The method for preparing source/drain electrodes herein will be illustrated in detail below, with reference to FIGS. 4A to 4G as in Embodiment 1.

Initially, an aluminum alloy thin film (Al-2.0 atomic percent Nd) 61 having a thickness of about 200 nm, and a molybdenum thin film 52 (not shown) having a thickness of about 50 nm were sequentially deposited on a glass substrate 1a typically by sputtering (FIG. 4A). The film-deposition by sputtering was carried out at room temperature. A pattern of a resist 62 was produced on the multilayer thin film by photolithography (FIG. 4B), and the multilayer film comprising the aluminum alloy thin film 61 and the molybdenum thin film 52 was etched using the patterned resist 62 as a mask to thereby form a gate electrode 26 (FIG. 4C). In this procedure, the periphery of the multilayer thin film is preferably etched in a taper-shape at an angle of about 30° to about 60° so as to improve the coverage of a gate insulator 27 to be deposited thereon.

Next, a silicon nitride film (gate insulator) 27 having a thickness of about 300 nm was deposited typically by plasma CVD (FIG. 4D). The film-deposition by plasma CVD herein was conducted at a temperature of about 320° C. On the silicon nitride film (gate insulator) 27 were sequentially deposited an undoped hydrogenated amorphous silicon film (a-Si—H) 55 having a thickness of about 200 nm and a phosphorus-doped n$^+$-type hydrogenated amorphous silicon film (n$^+$ a-Si—H) 56 having a thickness of about 80 nm typically by plasma CVD. The n$^+$-type hydrogenated amorphous silicon film was deposited by carrying out plasma CVD using SiH$_4$ and PH$_3$ as materials. The film-deposition temperature herein was set at 320° C.

Subsequently, a nitrogen-containing layer 60 was formed on the n+-type hydrogenated amorphous silicon film (n+ a-Si—H) 56 in the chamber of the plasma CVD system used for the deposition of the silicon nitride film (FIG. 4E). Specifically, the material gas used for the deposition of the amorphous silicon film was evacuated from the chamber while the substrate was kept in the chamber. Next, the surface of the low-resistance amorphous silicon film (n+-type hydrogenated amorphous silicon film 56) was treated with plasma for one minute, which plasma was generated while feeding nitrogen gas alone as a carrier gas to the chamber. Thus, a nitrogen-containing layer 60 was formed. This plasma treatment was carried out at a radio-frequency power density of 0.72 W/cm$^2$, a film-deposition temperature of 320° C. which is the same as the deposition temperature of the amorphous silicon film.

The plasma treatment was carried out at a varying gas pressure within the range of 33 to 399 Pa. However, plasma could be stably generated at a pressure of at most about 133 Pa, and samples treated with plasma at a pressure exceeding 133 Pa were not subjected to the subsequent steps.

Next, an Al-2.0 atomic percent Ni alloy film 63 having a thickness of about 300 nm was deposited on the nitrogen-containing layer 60 typically by sputtering (FIG. 4F). The film-deposition by sputtering was carried out at room temperature. A pattern of a resist was then produced by photolithography; and the Al-2.0 atomic percent Ni alloy film 63 was etched using the patterned resist as a mask, to thereby form a source electrode 28 and a drain electrode 29 (FIG. 4F). The n+-type hydrogenated amorphous silicon film 56 was stripped by dry etching using the source electrode 28 and the drain electrode 29 as a mask (FIG. 4G).

The above-prepared TFTs were subjected to annealing at 300° C. for thirty minutes. The annealing condition herein was set simulating such a heating treatment in a film-deposition step of a silicon nitride film (protecting film) as to yield a maximum thermal hysteresis. The TFT samples according to this Experimental Example have not been completed through various film-deposition steps as in actual thin-film transistor substrates, but the TFT samples after annealing are considered to have properties substantially reflecting the properties of actual thin-film transistor substrates.

Determination of Thin-Film Transistor Properties

The switching behaviors on drain current-gate voltage of the TFT test pieces were determined. Specifically, the OFF-state current and ON-state current were determined, and the switching behavior was evaluated by the procedure of Experimental Example 1.

The thin-film transistor properties of TFT samples according to Experimental Example 11 are shown in Table 7. As a comparative sample, a thin-film transistor was prepared by the procedure of Experimental Example 11, except for using source/drain electrodes comprising a pure aluminum thin film and chromium barrier metal layers and not conducting plasma treatment, and the properties of the TFT were measured. This result is also shown in Table 7 (Sample No. 1).

TABLE 7

| No. | Source/drain electrode | Plasma nitridation Pressure [Pa] | Thickness of nitrogen-containing layer [nm] | N/Si ratio | Surface density of nitrogen [cm$^{-2}$] | N1/O1 | OFF-state current [A] | ON-state current [A] | Evaluation |
|---|---|---|---|---|---|---|---|---|---|
| 1 | Cr + pure Al | no treatment | — | — | — | — | $4.0 \times 10^{-13}$ | $1.2 \times 10^{-5}$ | Good |
| 2 | Al-2.0 atomic % Ni | no treatment | — | — | — | — | $2.1 \times 10^{-9}$ | $6.4 \times 10^{-7}$ | NG |
| 3 | Al-2.0 atomic % Ni | 33 | <1 | 0.15 | $9.2 \times 10^{13}$ | 0.09 | $7.0 \times 10^{-10}$ | $8.2 \times 10^{-7}$ | NG |
| 4 | Al-2.0 atomic % Ni | 40 | 3.4 | 0.51 | $3.0 \times 10^{15}$ | 0.78 | $3.1 \times 10^{-12}$ | $8.1 \times 10^{-6}$ | NG |
| 5 | Al-2.0 atomic % Ni | 50 | 3.5 | 0.55 | $3.6 \times 10^{15}$ | 0.92 | $1.2 \times 10^{-12}$ | $9.0 \times 10^{-6}$ | NG |
| 6 | Al-2.0 atomic % Ni | 55 | 3.8 | 0.57 | $3.9 \times 10^{15}$ | 1 | $9.4 \times 10^{-13}$ | $9.6 \times 10^{-6}$ | Good |
| 7 | Al-2.0 atomic % Ni | 60 | 3.8 | 0.65 | $4.1 \times 10^{15}$ | 1.05 | $8.6 \times 10^{-13}$ | $9.7 \times 10^{-6}$ | Good |
| 8 | Al-2.0 atomic % Ni | 67 | 4.0 | 0.72 | $4.4 \times 10^{15}$ | 1.10 | $7.0 \times 10^{-13}$ | $9.8 \times 10^{-6}$ | Good |
| 9 | Al-2.0 atomic % Ni | 80 | 4.5 | 0.80 | $4.7 \times 10^{15}$ | 1.18 | $6.7 \times 10^{-13}$ | $1.0 \times 10^{-5}$ | Good |
| 10 | Al-2.0 atomic % Ni | 100 | 4.7 | 0.93 | $5.0 \times 10^{15}$ | 1.24 | $5.9 \times 10^{-13}$ | $1.1 \times 10^{-5}$ | Good |
| 11 | Al-2.0 atomic % Ni | 133 | 4.8 | 1 | $5.2 \times 10^{15}$ | 1.30 | $3.4 \times 10^{-13}$ | $1.1 \times 10^{-5}$ | Good |

Table 7 demonstrates as follows. Samples Nos. 6 to 11 which underwent plasma nitridation at a pressure of 55 to 133 Pa so as to have a ratio N1/O1 of 1.0 or more have good thin-film transistor properties substantially equivalent to those of Sample No. 1 as a conventional sample.

In contrast, Samples Nos. 3 to 5 which underwent plasma nitridation at a pressure of 50 Pa or less so as to have a ratio N1/O1 of less than 1.0, and Sample No. 2 which did not undergo plasma nitridation have poor thin-film transistor properties.

Of these samples, Samples Nos. 4 and 5 which underwent plasma nitridation at a pressure of 40 to 50 Pa have a decreased ON-state current. This is probably because the nitrogen-containing layer resultantly has a ratio N1/O1 of less 1.0 and thereby becomes more insulative.

Sample No. 3 which underwent plasma nitridation at a pressure of 33 Pa shows both a decreased ON-state current and an increased OFF-state current. This is probably because interdiffusion between silicon and aluminum occurs, since the plasma nitridation is insufficient and thereby fails to provide a layer effectively acting as a diffusion barrier.

Experimental Example 12

How the ratio N1/O1 varies depending on the plasma process temperature varying in the range of 280° C. to 340° C. was determined.

Specifically, TFT samples were prepared and thin-film transistor properties thereof were evaluated by the procedure of Experimental Example 11, except that plasma nitridation was conducted at a pressure of 67 Pa and a varying temperature as shown in Table 8.

The thin-film transistor properties of TFT samples according to Experimental Example 12 are shown in Table 8. As a comparative sample, a thin-film transistor was prepared by the procedure of Experimental Example 12, except for using source/drain electrodes comprising a pure aluminum thin film and chromium barrier metal layers and not conducting plasma treatment, and the properties of the TFT were measured. This result is also shown in Table 8 (Sample No. 1).

TABLE 8

| No. | Source/drain electrode | Temperature of plasma nitridation [° C.] | Thickness of nitrogen-containing layer [nm] | N/Si ratio | Surface density of nitrogen [cm$^{-2}$] | N1/O1 | OFF-state current [A] | ON-state current [A] | Evaluation |
|---|---|---|---|---|---|---|---|---|---|
| 1 | Cr + pure Al | no treatment | — | — | — | — | $4.0 \times 10^{-13}$ | $1.2 \times 10^{-5}$ | Good |
| 2 | Al-2.0 atomic % Ni | 280 | 4.3 | 0.51 | $3.0 \times 10^{15}$ | 0.78 | $3.5 \times 10^{-12}$ | $8.5 \times 10^{-6}$ | NG |
| 3 | Al-2.0 atomic % Ni | 290 | 4.1 | 0.55 | $3.6 \times 10^{15}$ | 0.92 | $1.9 \times 10^{-12}$ | $9.1 \times 10^{-6}$ | NG |
| 4 | Al-2.0 atomic % Ni | 300 | 4.1 | 0.57 | $4.1 \times 10^{15}$ | 1.01 | $9.8 \times 10^{-13}$ | $9.7 \times 10^{-6}$ | Good |
| 5 | Al-2.0 atomic % Ni | 310 | 3.9 | 0.65 | $4.3 \times 10^{15}$ | 1.05 | $8.2 \times 10^{-13}$ | $9.7 \times 10^{-6}$ | Good |
| 6 | Al-2.0 atomic % Ni | 320 | 4 | 0.72 | $4.4 \times 10^{15}$ | 1.10 | $7.0 \times 10^{-13}$ | $9.8 \times 10^{-6}$ | Good |
| 7 | Al-2.0 atomic % Ni | 330 | 3.8 | 0.8 | $4.8 \times 10^{15}$ | 1.21 | $6.2 \times 10^{-13}$ | $1.0 \times 10^{-5}$ | Good |
| 8 | Al-2.0 atomic % Ni | 340 | 3.7 | 0.85 | $5.0 \times 10^{15}$ | 1.30 | $5.0 \times 10^{-13}$ | $1.1 \times 10^{-5}$ | Good |

Table 8 demonstrates as follows. Samples Nos. 4 to 8 which underwent plasma nitridation at temperatures of 300° C. to 340° C. so as to have a ratio N1/O1 of 1.0 or more have good thin-film transistor properties substantially equivalent to those of Sample No. 1 as a conventional sample.

In contrast, Samples Nos. 2 and 3 which underwent plasma nitridation at temperatures lower than 300° C. so as to have a ratio N1/O1 less than 1.0 have a decreased ON-state current and show poor thin-film transistor properties. This is probably because the nitrogen-containing layer having a ratio N1/O1 of less than 1.0 becomes more insulative.

Experimental Example 13

How the ratio N1/O1 varies depending on the gas composition in plasma nitridation was determined.

Specifically, TFT samples were prepared and thin-film transistor properties thereof were evaluated by the procedure of Experimental Example 11, except for carrying out plasma nitridation at a temperature of 320° C. and a pressure of 67 Pa using pure $N_2$ gas alone (Sample No. 2 in Table 9) and a gaseous mixture of $N_2$ and 25% $NH_3$ (Sample No. 3 in Table 9).

The thin-film transistor properties of TFT samples according to Experimental Example 13 are shown in Table 9. As a comparative sample, a thin-film transistor was prepared by the procedure of Experimental Example 13, except for using source/drain electrodes comprising a pure aluminum thin film and chromium barrier metal layers and not conducting plasma nitridation, and the properties of the TFT were measured. This result is also shown in Table 9 (Sample No. 1).

gas and has excellent thin-film transistor properties substantially equivalent to those of Sample No. 1 as a comparative sample. This is probably because the reducing gas ($NH_3$) acts to further prevent the oxidation of the semiconductor layer.

Experimental Example 14

TFT samples were prepared in which nitrogen-containing layer was prepared in the same chamber of the system for deposition of the semiconductor layer at the same temperature as the film deposition temperature of the semiconductor layer, and the thin-film transistor properties of the TFT samples were determined.

Specifically, TFT samples were prepared by a modified method corresponding to the method described in Experimental Example 11. The method for preparing source/drain electrodes herein will be illustrated in detail below, with reference to FIGS. 4A to 4G.

Initially, an aluminum alloy thin film (Al-2.0 atomic percent Nd) 61 having a thickness of about 200 nm, and a molybdenum thin film 52 (not shown) having a thickness of about 50 nm were sequentially deposited on a glass substrate 1a typically by sputtering (FIG. 4A). The film-deposition by sputtering was carried out at room temperature. A pattern of a resist 62 was produced on the multilayer thin film by photolithography (FIG. 4B), and the multilayer film comprising the aluminum alloy thin film 61 and the molybdenum thin film 52 was etched using the patterned resist 62 as a mask to thereby form a gate electrode 26 (FIG. 4C). In this procedure, the periphery of the multilayer thin film is preferably etched in a

TABLE 9

| No. | Source/drain electrode | Gas composition in plasma nitridation | Thickness of nitrogen-containing layer [nm] | N/Si ratio | Surface density of nitrogen [cm$^{-2}$] | N1/O1 | OFF-state current [A] | ON-state current [A] | Evaluation |
|---|---|---|---|---|---|---|---|---|---|
| 1 | Cr + pure Al | no treatment | — | — | — | — | $4.0 \times 10^{-13}$ | $1.2 \times 10^{-5}$ | Good |
| 2 | Al-2.0 atomic % Ni | 100% nitrogen | 4 | 0.72 | $4.4 \times 10^{15}$ | 1.10 | $7.0 \times 10^{-13}$ | $9.8 \times 10^{-6}$ | Good |
| 3 | Al-2.0 atomic % Ni | $N_2$ + 25% $NH_3$ | 4.5 | 0.88 | $4.3 \times 10^{15}$ | 1.30 | $6.3 \times 10^{-13}$ | $1.1 \times 10^{-5}$ | Good |

As is demonstrated in Table 9, the thin-film transistor samples which underwent plasma nitridation using two different gases have good thin-film transistor properties. Among them, Sample No. 3 which underwent plasma nitridation using a gaseous mixture containing a reducing gas ($NH_3$) so as to have a ratio N1/O1 of 1.0 or more has a higher ON-state current than Sample No. 2 prepared without using a reducing taper-shape at an angle of about 30° to about 60° so as to improve the coverage of a gate insulator 27 to be deposited thereon.

Next, a silicon nitride film (gate insulator) 27 having a thickness of about 300 nm was deposited typically by plasma CVD (FIG. 4D). The film-deposition by plasma CVD herein was conducted at a temperature of about 320° C. On the silicon nitride film (gate insulator) 27 were sequentially deposited an undoped hydrogenated amorphous silicon film (a-Si—H) 55 having a thickness of about 200 nm and a phosphorus-doped n$^+$-type hydrogenated amorphous silicon film (n$^+$ a-Si—H) 56 having a thickness of about 80 nm typically by plasma CVD. The n$^+$-type hydrogenated amorphous silicon film was deposited by carrying out plasma CVD using $SiH_4$ and $PH_3$ as materials. The film-deposition temperature herein was set at 320° C.

Subsequently, the material gas used for the deposition of the amorphous silicon film was evacuated from the chamber while the substrate was kept in the chamber of the plasma CVD system used for the deposition of the silicon nitride film. Next, the surface of the low-resistance amorphous silicon film (n$^+$-type hydrogenated amorphous silicon film 56) was treated with plasma for one minute, which plasma was generated while feeding nitrogen gas alone as a carrier gas to the chamber. Thus, a nitrogen-containing layer 60 was formed (FIG. 4E). This plasma treatment was carried out at a radio-frequency power density of 0.72 W/cm$^2$, a film-deposition temperature of 320° C. which is the same as the deposition temperature of the amorphous silicon film, and a gas pressure of 67 Pa.

The surface of the work was analyzed by RBS and XPS to find that the nitrogen-containing layer was formed to a depth of about 4.0 nm from the surface. Namely, a nitrogen-containing layer having a thickness of about 4.0 nm was formed on the surface of the low-resistance amorphous silicon film by the method according to Experimental Example 14.

Next, an Al-2.0 atomic percent Ni alloy film 63 having a thickness of about 300 nm was deposited on the nitrogen-containing layer 60 typically by sputtering (FIG. 4F). The film-deposition by sputtering was carried out at room temperature. A pattern of a resist was then produced by photolithography; and the Al-2.0 atomic percent Ni alloy film 63 was etched using the patterned resist as a mask, to thereby form a source electrode 28 and a drain electrode 29 (FIG. 4F). The n$^+$-type hydrogenated amorphous silicon film 56 was stripped by dry etching using the source electrode 28 and the drain electrode 29 as a mask (FIG. 4G).

The above-prepared TFTs were subjected to annealing at 300° C. for thirty minutes. The annealing condition herein was set simulating such a heating treatment in a film-deposition step of a silicon nitride film (protecting film) as to yield a maximum thermal hysteresis. The TFT samples according to this Experimental Example have not been completed through various film-deposition steps as in actual thin-film transistor substrates, but the TFT samples after annealing are considered to have properties substantially reflecting the properties of actual thin-film transistor substrates.

Evaluation on Interdiffusion Between Silicon and Aluminum

On the TFT samples, the interface between the channel amorphous silicon thin film and the Al—Ni alloy thin film was observed to detect whether or not interdiffusion between silicon and aluminum occurred. Specifically, the interface was observed at a magnification of 60×10$^4$ times, and the interdiffusion between silicon and aluminum at the interface was quantitatively analyzed by energy dispersive X-ray fluorescence spectroscopy (EDX) by the procedure of Experimental Example 1.

Determination of Thin-Film Transistor Properties

The switching behaviors on drain current-gate voltage of the TFT sample were determined. Specifically, the OFF-state current and ON-state current were determined, and the switching behavior was evaluated by the procedure of Experimental Example 11.

Results

Figure 9:
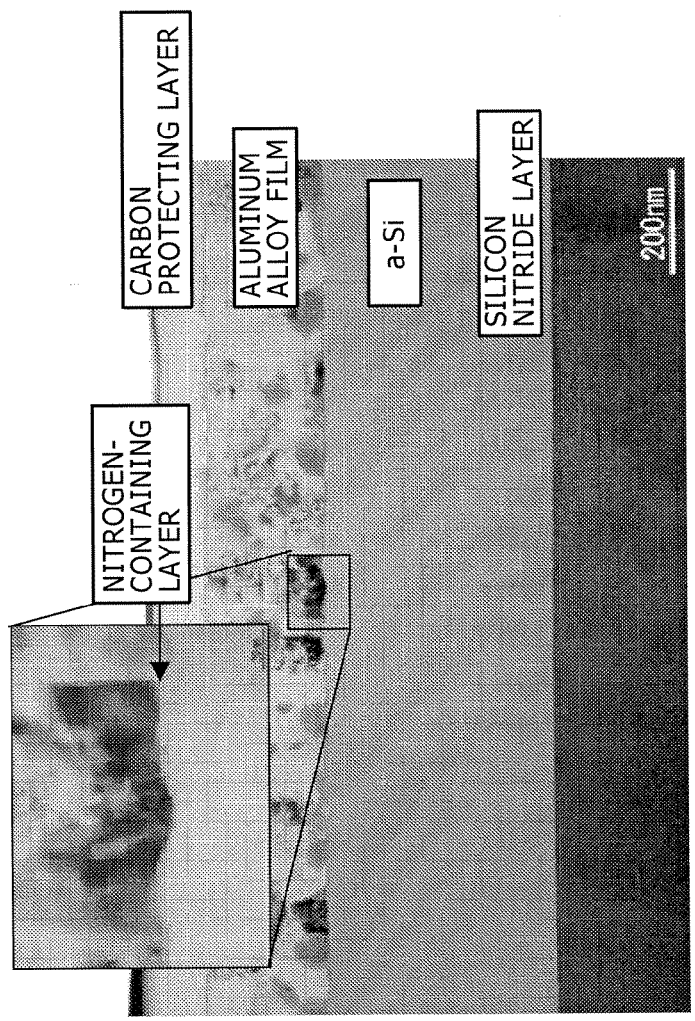
FIG. 9 is a cross-sectional transmission electron micrograph of the interface between a channel amorphous silicon thin film and an Al—Ni alloy thin film prepared in Experimental Example 14.

FIG. 9 is a cross-sectional transmission electron micrograph of the test piece according to Experimental Example 14. FIG. 9 demonstrates that a nitrogen-containing layer (nitride layer) is formed in the vicinity of the interface between the channel amorphous silicon thin film and the Al—Ni alloy thin film for source/drain electrodes. Black dense portions indicated by the arrow in FIG. 9 are precipitated $Al_3Ni$ grains.

The interface was analyzed by EDX to find that the interface is smooth without interdiffusion between silicon and aluminum.

This sample has an OFF-state current of 4.0×10$^{-13}$ A and an ON-state current of 1.2×10$^{-5}$ A and shows good thin-film transistor properties substantially equivalent to those of Comparative Sample 1.

Experimental Example 15

In this experimental example, plasma nitridation was conducted in the same chamber of the system for the deposition of the semiconductor layer, by using a gaseous mixture containing nitrogen and the gas used for deposition of the semiconductor layer. How the thin-film transistor properties are after this procedure was determined.

Specifically, an amorphous silicon film, and a low-resistance amorphous silicon film having a thickness of about 80 nm were deposited by the procedure of Experimental Example 14.

Next, plasma generation was suspended, and the surface of the low-resistance amorphous silicon layer was subjected to plasma treatment for ten seconds whereas plasma was generated while keeping feeding the material gas ($SiH_4$) for the deposition of the amorphous silicon film to the chamber and additionally feeding nitrogen gas as a carrier gas to the chamber. The plasma nitridation was thus carried out at a radio-frequency power density of 0.07 W/cm$^2$, a substrate temperature of 320° C., and a gas pressure of 67 Pa. The substrate temperature herein is the same as the film-deposition temperature of the amorphous silicon. The surface of the sample was analyzed by RBS and XPS to find that the nitrogen-containing layer was formed to a depth of about 6 nm from the surface. Namely, a nitrogen-containing layer having a thickness of about 6 nm was formed on the surface of the low-resistance amorphous silicon film by the method according to Experimental Example 15.

Next, a thin-film transistor was prepared and subjected to annealing by the procedure of Experimental Example 14.

Evaluations

On the prepared sample, the interface between the channel amorphous silicon thin film and the Al—Ni alloy thin film was observed to determine whether or not interdiffusion between silicon and aluminum occurred. Specifically, the interface was observed at a magnification of 60×10$^4$ times, and the interdiffusion between silicon and aluminum at the interface was quantitatively analyzed by energy dispersive X-ray fluorescence spectroscopy (EDX) by the procedure of Experimental Example 14.

The switching behaviors on drain current-gate voltage of the TFT sample were determined. Specifically, the OFF-state current and ON-state current were determined, and the switching behavior was evaluated by the procedure of Experimental Example 14.

Results

Figure 10:
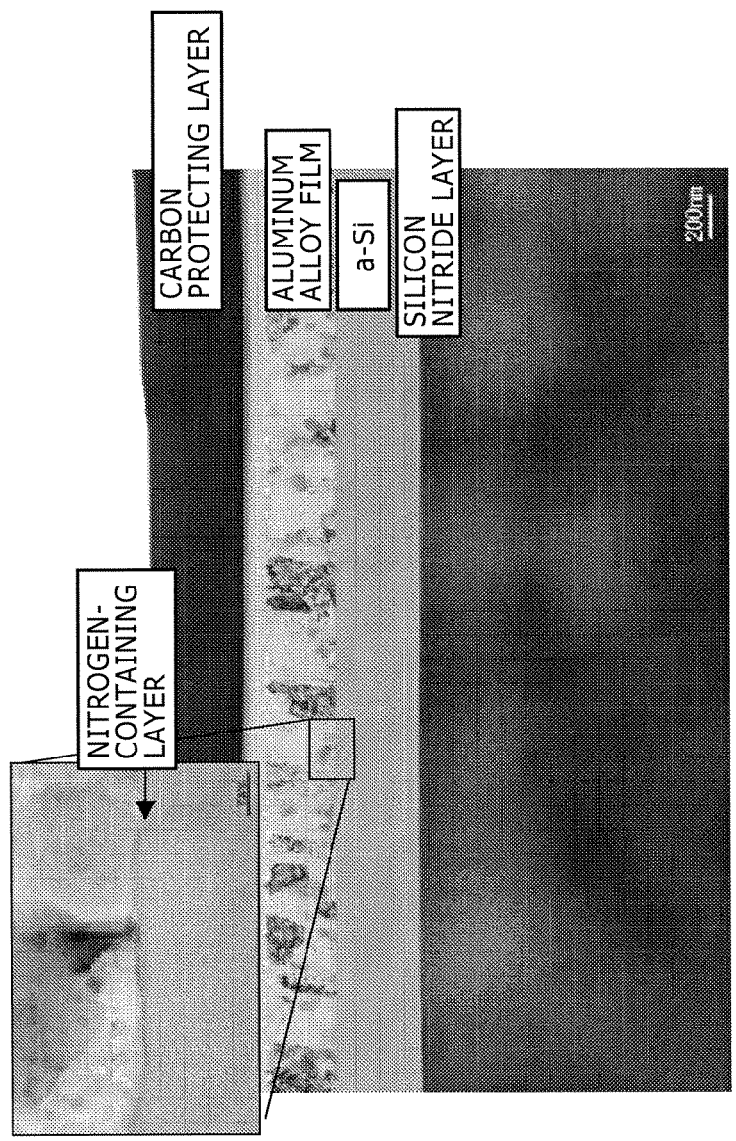
FIG. 10 is across-sectional transmission electron micrograph of the interface between a channel amorphous silicon thin film and an Al—Ni alloy thin film prepared in Experimental Example 15.

FIG. 10 is across-sectional transmission electron micrograph of the sample according to Experimental Example 15. FIG. 10 demonstrates that a nitrogen-containing layer (nitride layer) is formed in the vicinity of the interface between the channel amorphous silicon thin film and the Al—Ni alloy thin film for source/drain electrodes. Black dense portions indicated by the arrow in FIG. 10 are precipitated Al$_3$Ni grains.

The interface was analyzed by EDX to find that the interface is smooth without interdiffusion between silicon and aluminum.

This sample has an OFF-state current of 4.0×10$^{-13}$ A and an ON-state current of 1.0×10$^{-5}$ A and shows good thin-film transistor properties substantially equivalent to those of Comparative Sample 1.

Experimental Example 16

Experiments were made so as to verify that good direct-contact resistance (contact resistance) and thermal stability can be obtained by using source/drain electrodes comprising an Al—Ni alloy and a nitrogen-containing layer as in the present invention, even when the Al—Ni alloy thin film is brought in direct contact with the transparent picture electrode without the interposition of a barrier metal layer.

Specifically, samples comprising any of the source/drain electrodes in Table 10 and an ITO film deposited on the aluminum alloy thin film of the source/drain electrode were prepared by carrying out sputtering at 200° C. in an atmosphere of argon gas at a pressure of 3 mTorr for 20 minutes. The source/drain electrodes were prepared by plasma nitridation process under varying conditions as in Table 10 so as to have, for example, different thickness of the nitrogen-containing layer. The ITO film comprises indium oxide and 10 percent by mass of tin oxide.

On the above-prepared samples, the direct contact resistance (contact resistance) and the occurrence of hillocks (thermal stability) were determined by the following methods.

Determination of Contact Resistivity

Figure 7:
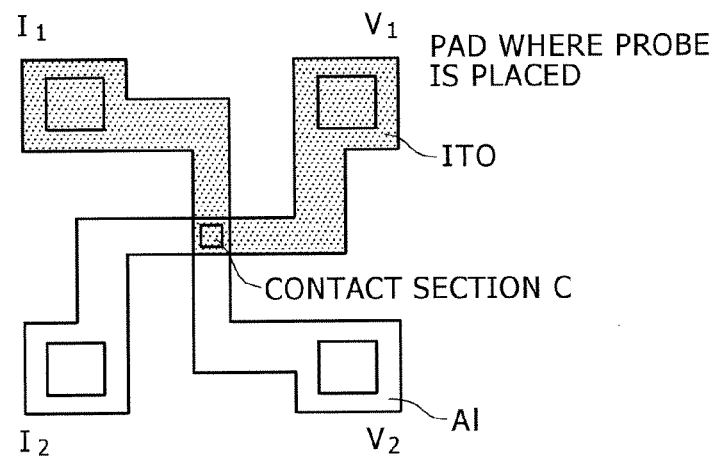
FIG. 7 shows a Kelvin pattern used to measure the contact resistivity between an aluminum alloy thin film and a transparent picture electrode.

A Kelvin pattern having a contact hole size of 10 µm square as shown in FIG. 7 was prepared, and a four-terminal measurement was conducted. Specifically, an electrical current was passed through between an ITO (or IZO) and the aluminum alloy using two terminals, and the voltage drop between the ITO (or IZO) and the aluminum alloy was measured using other two terminals. More specifically, a current I was passed through I$_1$-I$_2$, the voltage V between V$_1$ and V$_2$ was measured (FIG. 7), and the direct contact resistivity R of the contact C was determined by calculation according to the equation: R=(V$_2$-V$_1$)/I$_2$. The contact resistivity was evaluated as follows. By taking the contact resistivity between a chromium thin film and an ITO film as the reference value (2×10$^{-4}$ Ω·cm$^2$ or less), a sample having the contact resistivity equal to or less than 2×10$^{-4}$ Ω·cm$^2$ was evaluated as "Good", and one having a contrast resistivity more than 2×10$^{-4}$ Ω·cm$^2$ was evaluated as "NG".

Occurrence of Hillocks (Thermal Stability)

A 10-µm line-and-space pattern was produced on the samples, a vacuum heat treatment was conducted at 250° C. for thirty minutes, the surface of the line-and-space pattern as interconnection was observed by SEM, and the number of hillocks having a diameter of 0.1 µm or more was counted. A sample having a hillock density of 1×10$^9$ or less per square millimeter was evaluated as "Good", and one having a hillock density exceeding 1×10$^9$ per square millimeter was evaluated as "NG".

The results are shown in Table 10. The thin-film transistor properties of the samples as in Table 2 are also shown in Table 10. The "Overall rating" shows the overall rating of the contact resistivity and the thin-film transistor properties. In "Overall rating", a sample which is good both in contact resistivity and thin-film transistor properties was evaluated as "Good", and one which is poor in at least one of contact resistivity and thin-film transistor properties was evaluated as "NG".

TABLE 10

| No. | Source/drain electrode | Plasma nitridation | Thickness of nitrogen-containing layer [nm] | N/Si ratio | Surface density of nitrogen [cm$^{-2}$] | OFF-state current [A] | ON-state current [A] | Contact resistivity with ITO [Ω · cm$^2$] | Thermo-stability | Overall rating |
|---|---|---|---|---|---|---|---|---|---|---|
| 1 | Cr | none | — | — | — | 4.0 × 10$^{-13}$ | 1.2 × 10$^{-5}$ | 4.0 × 10$^{-5}$ | Good | Good |
| 2 | Al-2.0 atomic % Ni | none | — | — | — | 2.1 × 10$^{-9}$ | 6.4 × 10$^{-7}$ | 7.0 × 10$^{-5}$ | Good | NG |
| 3 | Al-2.0 atomic % Ni | 0.5 min. | <1 | 0.15 | 9.2 × 10$^{13}$ | 7.0 × 10$^{-10}$ | 8.2 × 10$^{-7}$ | 7.0 × 10$^{-5}$ | Good | NG |
| 4 | Al-2.0 atomic % Ni | 1 min. | 4.5 | 0.62 | 5.8 × 10$^{15}$ | 4.0 × 10$^{-13}$ | 1.2 × 10$^{-5}$ | 7.0 × 10$^{-5}$ | Good | Good |
| 5 | Al-2.0 atomic % Ni | 3 min. | 5.8 | 1 | 6.8 × 10$^{15}$ | 3.4 × 10$^{-13}$ | 1.1 × 10$^{-5}$ | 7.0 × 10$^{-5}$ | Good | Good |
| 6 | Al-2.0 atomic % Ni | 5 min. | 6.3 | 1.1 | 7.0 × 10$^{15}$ | 3.1 × 10$^{-13}$ | 1.1 × 10$^{-5}$ | 7.0 × 10$^{-5}$ | Good | Good |
| 7 | Al-2.0 atomic % Ni | 10 min. | 7.2 | 1.3 | 7.3 × 10$^{15}$ | 2.8 × 10$^{-13}$ | 9.8 × 10$^{-6}$ | 7.0 × 10$^{-5}$ | Good | Good |
| 8 | Al-2.0 atomic % Ni | 30 min. | 21 | 1.3 | 2.1 × 10$^{16}$ | 2.5 × 10$^{-13}$ | 1.4 × 10$^{-6}$ | 7.0 × 10$^{-5}$ | Good | NG |

In Table 10, Samples Nos. 4 to 7 are samples satisfying the preferred conditions in the present invention, Sample No. 2 is a comparative sample having no nitrogen-containing layer, Samples Nos. 3 and 8 are referential samples which does not satisfy the preferred conditions in the present invention, and Sample No. 9 is a referential sample comprising pure aluminum layer as the source/drain electrode.

Table 10 shows that Samples No. 4 to 7 have contact resistivity and thermal stability as good as Sample No. 1 (conventional equivalent). They are prepared by setting the plasma irradiation time at about 1 minute to 10 minutes and suitably controlling the thickness of the nitrogen-containing layer, the N/Si ratio (the ratio of the number of nitrogen atoms to the number of silicon atoms), and the surface density of nitrogen.

In contrast, the referential samples (Samples Nos. 3, 8 and 9) are somewhat poor in these properties, as compared with Sample No. 1 (comparative sample). Of these referential samples, Sample No. 9 comprising a specific nitrogen-containing layer and a conventional pure aluminum layer has good thin-film transistor properties but is poor in contact resistivity and thermal stability. Thus, the direct contact between this sample and the ITO film was not established.

Experimental Example 17

Samples were prepared and the contact resistivity and thermal stability thereof were determined by the procedure of Experimental Example 16, except for varying the nickel or lanthanum content of the Al—Ni alloy or the Al—Ni—La alloy as in Table 11. The plasma nitridation process was conducted under the same conditions as in Experimental Example 16, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 11.

TABLE 11

| Source/drain electrode | OFF-state current [A] | ON-state current [A] | Contact resistivity with ITO [Ω cm$^2$] | Thermo-stability | Overall rating |
|---|---|---|---|---|---|
| Al-0.1 atomic % Ni | $4.1 \times 10^{-13}$ | $1.2 \times 10^{-5}$ | $2.0 \times 10^{-4}$ | NG | NG |
| Al-0.3 atomic % Ni | $3.2 \times 10^{-13}$ | $1.1 \times 10^{-5}$ | $1.0 \times 10^{-4}$ | Good | Good |
| Al-0.5 atomic % Ni | $3.9 \times 10^{-13}$ | $1.1 \times 10^{-5}$ | $9.0 \times 10^{-5}$ | Good | Good |
| Al-4.0 atomic % Ni | $5.1 \times 10^{-13}$ | $1.1 \times 10^{-5}$ | $5.0 \times 10^{-5}$ | Good | Good |
| Al-6.0 atomic % Ni | $5.3 \times 10^{-13}$ | $1.2 \times 10^{-5}$ | $3.0 \times 10^{-5}$ | Good | Good |
| Al-0.1% atomic % Ni-0.35 atomic % La | $5.6 \times 10^{-13}$ | $1.1 \times 10^{-5}$ | $2.0 \times 10^{-4}$ | Good | Good |
| Al-0.3 atomic % Ni-0.35 atomic % La | $6.2 \times 10^{-13}$ | $1.1 \times 10^{-5}$ | $1.0 \times 10^{-4}$ | Good | Good |

Table 11 demonstrates that the TFT samples using Al—Ni alloy thin films having a varying nickel content within the range from 0.1 atomic percent to 6 atomic percent are excellent in contact resistivity. Moreover, Al—Ni thin films having a varying Ni content within the range from 0.3 atomic percent to 6 atomic percent and Al—Ni—La alloy thin films are excellent in thermal stability.

Experimental Example 18

Thin-film transistor samples were prepared and the contact resistivity and thermal stability thereof were determined by the procedure of Experimental Example 16, except for further incorporating La or Nd as a third component to an Al-2.0 atomic percent Ni alloy and varying the content of La or Nd as in Table 12. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 12.

TABLE 12

| Source/drain electrode | OFF-state current [A] | ON-state current [A] | Contact resistivity with ITO [Ω cm$^2$] | Thermal stability | Overall rating |
|---|---|---|---|---|---|
| Al-2.0 atomic % Ni-0.1 atomic % La | $3.3 \times 10^{-13}$ | $1.2 \times 10^{-5}$ | $1.0 \times 10^{-4}$ | Good | Good |
| Al-2.0 atomic % Ni-0.3 atomic % La | $5.3 \times 10^{-13}$ | $1.1 \times 10^{-5}$ | $1.0 \times 10^{-4}$ | Good | Good |
| Al-2.0 atomic % Ni-2.0 atomic % La | $7.4 \times 10^{-13}$ | $1.1 \times 10^{-5}$ | $2.0 \times 10^{-4}$ | Good | Good |
| Al-2.0 atomic % Ni-0.1 atomic % Nd | $4.0 \times 10^{-13}$ | $1.2 \times 10^{-5}$ | $9.0 \times 10^{-5}$ | Good | Good |
| Al-2.0 atomic % Ni-0.3 atomic % Nd | $6.7 \times 10^{-13}$ | $1.2 \times 10^{-5}$ | $1.0 \times 10^{-4}$ | Good | Good |
| Al-2.0 atomic % Ni-1.0 atomic % Nd | $5.8 \times 10^{-13}$ | $1.2 \times 10^{-5}$ | $2.0 \times 10^{-4}$ | Good | Good |

Table 12 demonstrates that the TFT samples using Al—Ni—La alloys containing 0.1 atomic percent to 2.0 atomic percent of La and those using Al—Ni—Nd alloys containing 0.1 atomic percent to 2.0 atomic percent of Nd have good thin-film transistor properties and are good in contact resistivity and thermal stability.

Experimental Example 19

Thin-film transistor samples were prepared and the contact resistivity and thermal stability thereof were determined by the procedure of Experimental Example 16, except for further incorporating 0.3 atomic percent of any of the elements shown in Table 13 (the elements belonging to Group X1) as a third component to an Al-2.0 atomic percent Ni alloy. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 13.

TABLE 13

| Source/drain electrode | OFF-state current [A] | ON-state current [A] | Contact resistivity with ITO [Ω cm$^2$] | Thermal stability | Overall rating |
|---|---|---|---|---|---|
| Al-2.0 atomic % Ni-0.3 atomic % Ti | $3.1 \times 10^{-13}$ | $1.2 \times 10^{-5}$ | $1.0 \times 10^{-4}$ | Good | Good |
| Al-2.0 atomic % Ni-0.3 atomic % V | $5.5 \times 10^{-13}$ | $1.1 \times 10^{-5}$ | $1.0 \times 10^{-4}$ | Good | Good |
| Al-2.0 atomic % Ni-0.3 | $7.9 \times 10^{-13}$ | $1.1 \times 10^{-5}$ | $2.0 \times 10^{-4}$ | Good | Good |

TABLE 13-continued

| Source/drain electrode | OFF-state current [A] | ON-state current [A] | Contact resistivity with ITO [$\Omega$ cm$^2$] | Thermal stability | Overall rating |
|---|---|---|---|---|---|
| atomic % Zr | | | | | |
| Al-2.0 atomic % Ni-0.3 atomic % Nb | $6.0 \times 10^{-13}$ | $1.2 \times 10^{-5}$ | $8.0 \times 10^{-5}$ | Good | Good |
| Al-2.0 atomic % Ni-0.3 atomic % Mo | $3.7 \times 10^{-13}$ | $1.2 \times 10^{-5}$ | $1.0 \times 10^{-4}$ | Good | Good |
| Al-2.0 atomic % Ni-0.3 atomic % Hf | $9.8 \times 10^{-13}$ | $1.2 \times 10^{-5}$ | $9.0 \times 10^{-5}$ | Good | Good |
| Al-2.0 atomic % Ni-0.3 atomic % Ta | $3.7 \times 10^{-13}$ | $1.2 \times 10^{-5}$ | $8.0 \times 10^{-5}$ | Good | Good |
| Al-2.0 atomic % Ni-0.3 atomic % W | $5.6 \times 10^{-13}$ | $1.1 \times 10^{-5}$ | $1.0 \times 10^{-4}$ | Good | Good |

Table 13 shows that the TFT samples using Al—Ni—X1 alloys comprising the elements belonging to Group X1 have good thin-film transistor properties and are good in contact resistivity and thermal stability.

Experimental Example 20

Thin-film transistor samples were prepared and the contact resistivity and thermal stability thereof were determined by the procedure of Experimental Example 16, except for further incorporating 1.0 atomic percent of any of the elements shown in Table 14 (the elements belonging to Group X2) as a third component to an Al-2.0 atomic percent Ni alloy. The plasma nitridation process was conducted under the same conditions as in Experimental Example 1, in which the plasma irradiation time was three minutes, and the resulting nitrogen-containing layer had a thickness of about 5.8 nm, a N/Si ratio of 1.0, and a surface density of nitrogen of $6.8 \times 10^{15}$ cm$^{-2}$.

The results are shown in Table 14.

TABLE 14

| Source/drain electrode | OFF-state current [A] | ON-state current [A] | Contact resistivity with ITO [$\Omega$ cm$^2$] | Thermal stability | Overall rating |
|---|---|---|---|---|---|
| Al-2.0 atomic % Ni-1.0 atomic % Mg | $1.5 \times 10^{-12}$ | $1.3 \times 10^{-5}$ | $1.0 \times 10^{-4}$ | Good | Good |
| Al-2.0 atomic % Ni-1.0 atomic % Cr | $9.1 \times 10^{-13}$ | $1.2 \times 10^{-5}$ | $1.0 \times 10^{-4}$ | Good | Good |
| Al-2.0 atomic % Ni-1.0 atomic % Mn | $7.2 \times 10^{-13}$ | $1.1 \times 10^{-5}$ | $2.0 \times 10^{-4}$ | Good | Good |
| Al-2.0 atomic % Ni-1.0 atomic % Ru | $5.9 \times 10^{-13}$ | $1.1 \times 10^{-5}$ | $8.0 \times 10^{-5}$ | Good | Good |
| Al-2.0 atomic % Ni-1.0 atomic % Rh | $6.5 \times 10^{-13}$ | $1.3 \times 10^{-5}$ | $1.0 \times 10^{-4}$ | Good | Good |
| Al-2.0 atomic % Ni-1.0 atomic % Pd | $4.5 \times 10^{-13}$ | $1.3 \times 10^{-5}$ | $9.0 \times 10^{-5}$ | Good | Good |
| Al-2.0 atomic % Ni-1.0 atomic % Ir | $4.1 \times 10^{-13}$ | $1.2 \times 10^{-5}$ | $8.0 \times 10^{-5}$ | Good | Good |
| Al-2.0 atomic % Ni-1.0 atomic % Pt | $5.2 \times 10^{-13}$ | $1.1 \times 10^{-5}$ | $1.0 \times 10^{-4}$ | Good | Good |
| Al-2.0 atomic % Ni-1.0 atomic % Gd | $8.9 \times 10^{-13}$ | $1.1 \times 10^{-5}$ | $1.0 \times 10^{-4}$ | Good | Good |
| Al-2.0 atomic % Ni-1.0 atomic % Tb | $1.5 \times 10^{-12}$ | $1.3 \times 10^{-5}$ | $2.0 \times 10^{-4}$ | Good | Good |
| Al-2.0 atomic % Ni-1.0 atomic % Dy | $5.2 \times 10^{-13}$ | $1.1 \times 10^{-5}$ | $9.0 \times 10^{-5}$ | Good | Good |
| Al-2.0 atomic % Ni-1.0 atomic % Y | $4.9 \times 10^{-13}$ | $1.1 \times 10^{-5}$ | $8.0 \times 10^{-5}$ | Good | Good |
| Al-2.0 atomic % Ni-1.0 atomic % Co | $8.1 \times 10^{-13}$ | $1.1 \times 10^{-5}$ | $1.0 \times 10^{-4}$ | Good | Good |
| Al-2.0 atomic % Ni-1.0 atomic % Fe | $7.3 \times 10^{-13}$ | $1.2 \times 10^{-5}$ | $2.0 \times 10^{-4}$ | Good | Good |

Table 14 demonstrates that the TFT samples prepared by using Al—Ni—X2 alloys containing the elements belonging to Group X2 are good in thin-film transistor properties, contact resistivity and thermal stability.

The foregoing invention has been described in terms of preferred embodiments. However, those skilled, in the art will recognize that many variations of such embodiments exist. Such variations are intended to be within the scope of the present invention and the appended claims.

What is claimed is:

1. A source/drain electrode for use in a thin-film transistor substrate comprising a substrate, a thin-film transistor semiconductor layer, source/drain electrodes, and a transparent picture electrode,
the source/drain electrode comprising a nitrogen-containing layer and a thin film of pure aluminum or an aluminum alloy,
wherein the source/drain electrode is so configured that nitrogen of the nitrogen-containing layer binds to silicon of the thin-film transistor semiconductor layer, and
wherein the source/drain electrode is so configured that the thin film of pure aluminum or aluminum alloy is connected to the thin-film transistor semiconductor layer through the nitrogen-containing layer.

2. The source/drain electrode according to claim 1, wherein the nitrogen-containing layer mainly comprises a silicon nitride.

3. The source/drain electrode according to claim 1, wherein the nitrogen-containing layer comprises a silicon oxynitride.

4. The source/drain electrode according to claim 1, wherein the nitrogen-containing layer has a surface density of nitrogen atoms (N1) of $10^{14}$ cm$^{-2}$ or more and $2\times10^{16}$ cm$^{-2}$ or less.

5. The source/drain electrode of claim 3, wherein the nitrogen-containing layer has a surface density of nitrogen atoms "N1" and a surface density of oxygen atoms "O1", and wherein the ratio of N1 to O01 (N1/O1) is 1.0 or more.

6. The source/drain electrode according to claim 1, wherein the nitrogen-containing layer has a surface density of nitrogen atoms equal to or higher than the surface density of silicon effective dangling bonds constituting the semiconductor layer.

7. The source/drain electrode according to claim 1, wherein the nitrogen-containing layer has a thickness within the range of 0.18 nm or more and 20 nm or less.

8. The source/drain electrode according to claim 1, wherein the nitrogen-containing layer has a number of nitrogen atoms "N" and a number of silicon atoms "Si", and wherein the maximum ratio of "N" to "Si" (N/Si) is within the range of 0.5 or more and 1.5 or less.

9. The source/drain electrode according to claim 1, wherein the thin-film transistor semiconductor layer comprises an amorphous silicon or a polycrystalline silicon.

10. The source/drain electrode according to claim 1, wherein the aluminum alloy comprises 6 atomic percent or less of nickel (Ni) as an alloy element.

11. The source/drain electrode according to claim 10,
wherein the aluminum alloy comprises 0.3 atomic percent or more and 6 atomic percent or less of nickel (Ni) as an alloy element, and
wherein the source/drain electrode is so configured that the thin film of aluminum alloy is further directly connected to the transparent picture electrode.

12. The source/drain electrode according to claim 10, wherein the aluminum alloy further comprises 0.1 atomic percent or more and 1.0 atomic percent or less of at least one element selected from the group consisting of Ti, V, Zr, Nb, Mo, Hf, Ta, and W as an alloy element.

13. The source/drain electrode according to claim 10, wherein the aluminum alloy further comprises 0.1 atomic percent or more and 2.0 atomic percent or less of at least one element selected from the group consisting of Mg, Cr, Mn, Ru, Rh, Pd, Ir, Pt, La, Gd, Tb, Dy, Nd, Y, Co, and Fe as an alloy element.

14. A thin-film transistor substrate comprising the source/drain electrodes according to claim 1.

15. A display device comprising the thin-film transistor substrate according to claim 14.

* * * * *